United States Patent
Izumi et al.

(10) Patent No.: US 6,649,438 B2
(45) Date of Patent: Nov. 18, 2003

(54) MANUFACTURING METHOD FOR TWO-DIMENSIONAL IMAGE DETECTORS AND TWO-DIMENSIONAL IMAGE DETECTORS

(75) Inventors: Yoshihiro Izumi, Kashihara (JP); Osamu Teranuma, Tenri (JP); Toshinori Yoshimuta, Takatsuki (JP); Shinya Hirasawa, Uji (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/329,491

(22) Filed: Dec. 27, 2002

(65) Prior Publication Data

US 2003/0096445 A1 May 22, 2003

Related U.S. Application Data

(63) Continuation of application No. 09/657,528, filed on Sep. 8, 2000, now Pat. No. 6,559,451.

(30) Foreign Application Priority Data

Sep. 8, 1999 (JP) ............................................. 11-254688
Jul. 7, 2000 (JP) ....................................... 2000-207383

(51) Int. Cl.$^7$ ......................... H01L 21/66; H01L 21/00; H01L 21/44
(52) U.S. Cl. .......................... 438/30; 438/16; 438/114; 257/417
(58) Field of Search ..................................... 438/1–983

(56) References Cited

U.S. PATENT DOCUMENTS

| | | | |
|---|---|---|---|
| 4,288,264 A | 9/1981 | Haque | 156/67 |
| 4,768,073 A | 8/1988 | Adams | 357/30 |
| 5,319,206 A | 6/1994 | Lee et al. | 250/370 |
| 5,323,051 A * | 6/1994 | Adams et al. | |
| 5,365,356 A | 11/1994 | McFadden | 359/62 |
| 5,380,179 A | 1/1995 | Nishimura et al. | 419/36 |
| 5,693,947 A | 12/1997 | Morton | 250/370.09 |
| 5,718,615 A | 2/1998 | Boucher et al. | 451/41 |
| 6,008,070 A * | 12/1999 | Farnworth | |
| 6,344,370 B1 * | 2/2002 | Izumi et al. | |

OTHER PUBLICATIONS

Jeromin, L.S. et al., "Application of a–Si Active–Matrix Technology in a X–Ray Detector Panel", SID 97 Digest, May, 1997, pp. 91–94.

* cited by examiner

Primary Examiner—John F. Niebling
Assistant Examiner—Stanetta Isaac
(74) Attorney, Agent, or Firm—Nixon & Vanderhye, P.C.

(57) ABSTRACT

A TFT array is formed on a glass substrate (step P1). A surface protection layer is formed on the glass substrate so as to cover the TFT array (step P2). The glass substrate is divided to form active matrix, substrates with the surface protection layer being provided (step P3). The divided active matrix substrate is chamfered along its edges (step P4). The surface protection layer is removed from the active matrix substrate (step P5). An X-ray conductive layer is formed on the TFT array where the surface protection layer has been removed (step P6). By these steps, pollutants produced during the division and chamfering of the glass substrate are prevented from polluting the TFT array and the X-ray conductive layer, and the active element array and the semiconductor layer is prevented from deteriorating in terms of performance in manufacturing process for a two-dimensional image detector.

12 Claims, 18 Drawing Sheets

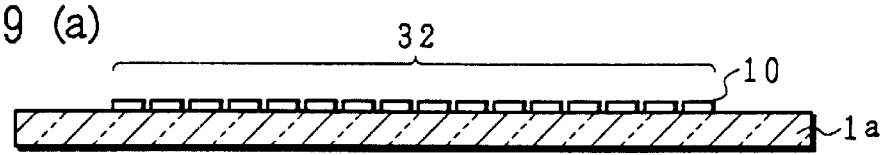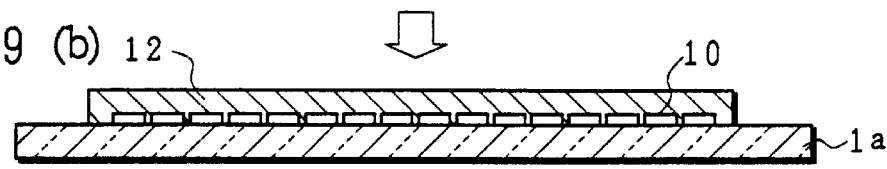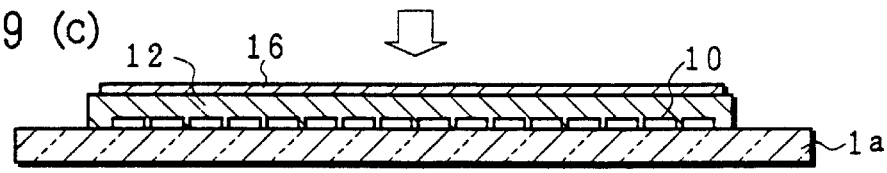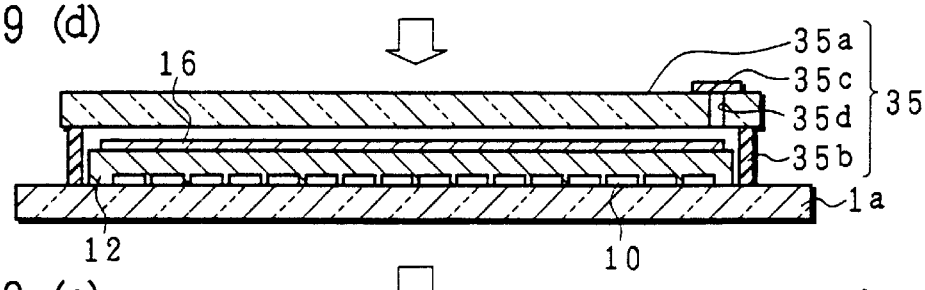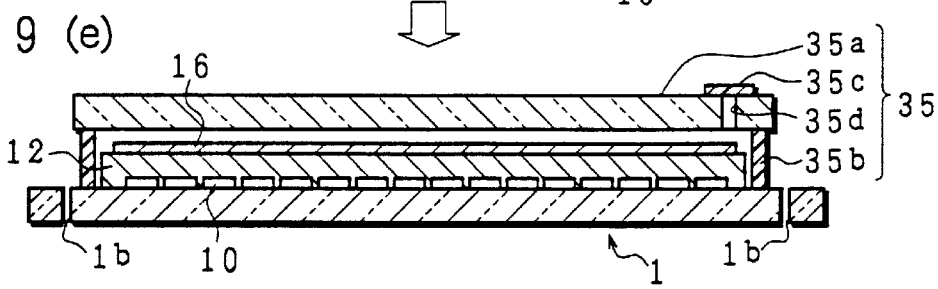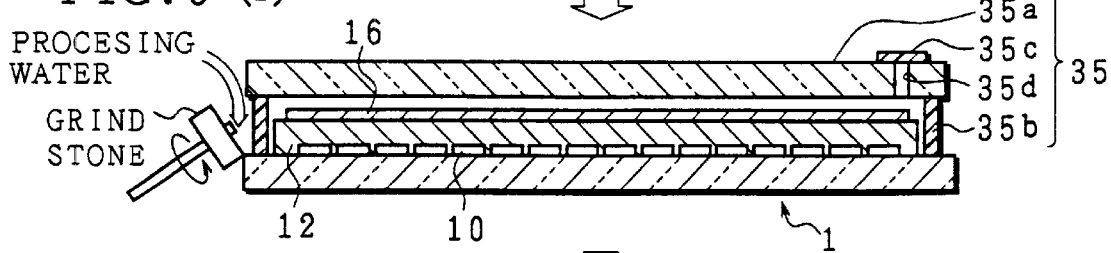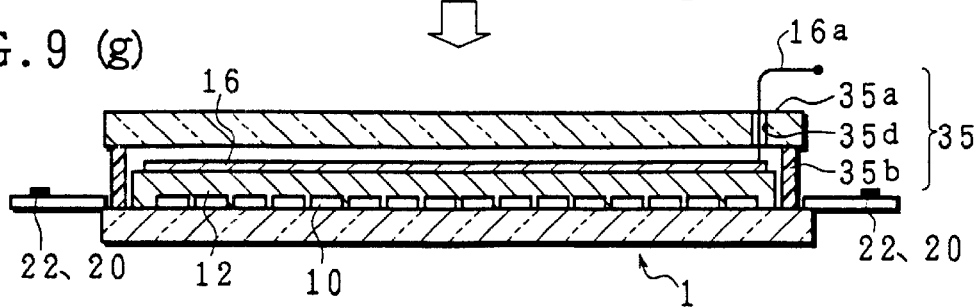

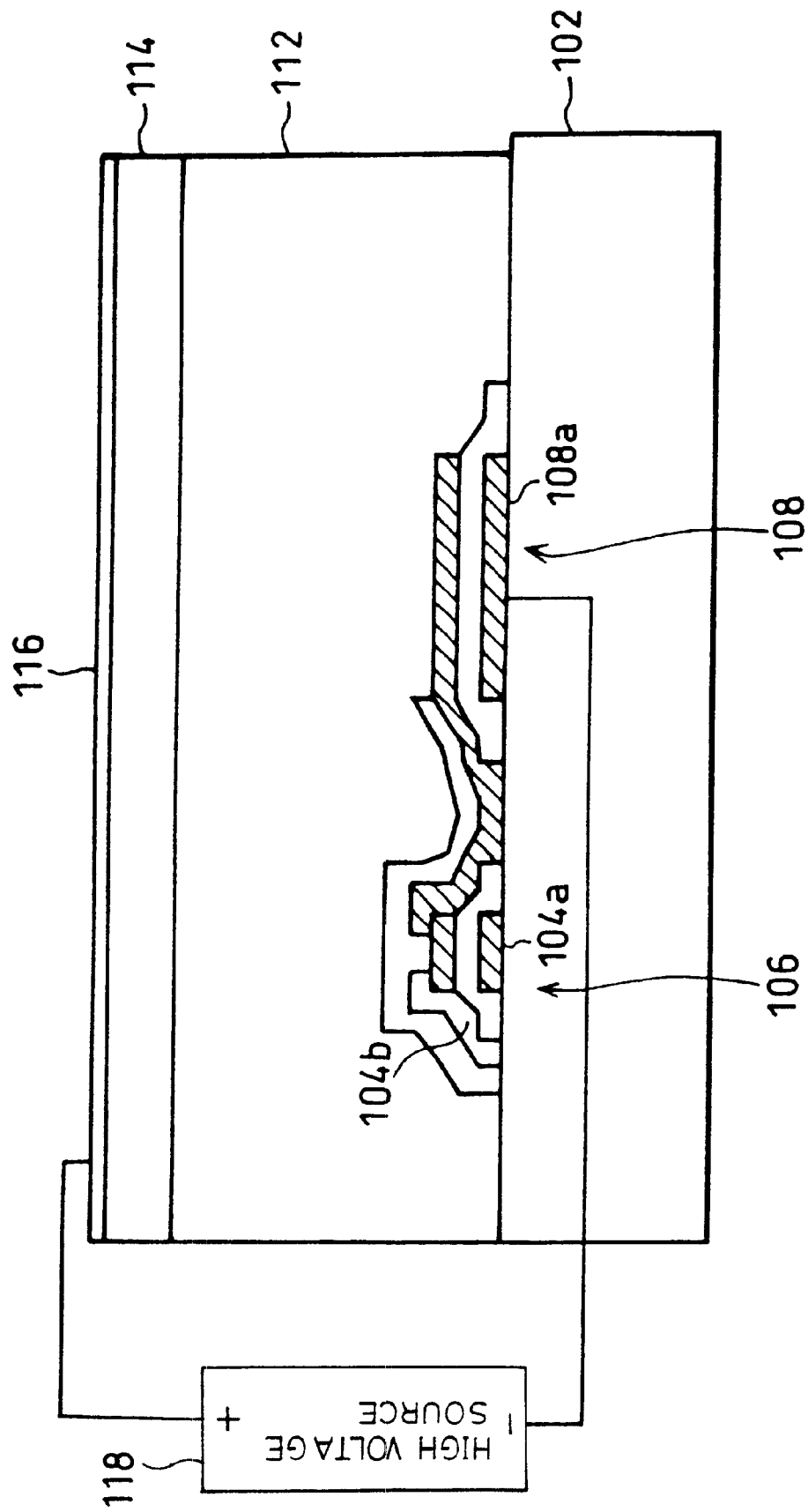

MANUFACTURING METHOD FOR TWO-DIMENSIONAL IMAGE DETECTORS AND TWO-DIMENSIONAL IMAGE DETECTORS

This application is a continuation of U.S. patent application Ser. No. 09/657,528, now U.S. Pat. No. 6,559,451 filed Sep. 8, 2000, the entire content of which is hereby incorporated by reference in this application.

FIELD OF THE INVENTION

The present invention relates to manufacturing methods for two-dimensional image detectors capable of detecting images by means of X-rays and other kind of radiation and visible, infrared, and other kind of light and also relates to those two-dimensional image detectors.

BACKGROUND OF THE INVENTION

Conventionally known radiation two-dimensional image detectors (hereinafter, will be referred to simply as two-dimensional image detectors) include semiconductor sensors arranged in rows and columns with a switching element provided to each of the sensors. The semiconductor sensor generates electric charges (electron-hole pairs) upon detection of X-rays or other radiation (hereinafter, will be simply referred to as radiation). In the two-dimensional image detector, all the switching elements in a row are turned on to read electric charges from the semiconductor sensor in each column. The reading operation is performed for each column to detect a two-dimensional image.

The structure and principles of the two-dimensional image detector are explained in specific terms in publications including L. S. Jeromin, et al., "Application of a-Si Active-Matrix Technology in a X-Ray Detector Panel", SID 97 DIGEST, pp. 91–94, 1997; and Japanese Laid-Open Patent Application No. 6-342098/1994 (Tokukaihe 6-342098; published on 13 December 1994).

Now, the structure and principles of the conventional two-dimensional image detector will be discussed in reference to FIGS. 17 and 13. Whilst FIG. 17 is a perspective view schematically showing a structure of the two-dimensional image detector, FIG. 18 is a cross-sectional view showing a structure of a pixel shown in FIG. 17.

The two-dimensional image detector includes an active matrix substrate 100, a photoconductive film 112, a dielectric layer 114, an upper electrode 116, a high voltage source 118, and an amplifier 120.

The active matrix substrate 100 is constituted by a glass substrate 102, electrode wires (gate electrode line 104a and data electrode line 104b) 104 arranged in an XY matrix (arranged in rows and columns) on the glass substrate 102, thin film transistors (hereinafter, will be referred to as TFTs) 106 connected to the electrode wires 104, electric charge storage capacitances 108 connected to the TFTs 106, etc.

The active matrix substrate 100 may be one of those used in manufacture of liquid crystal displays. An active matrix substrate used in an active matrix liquid crystal display (AMLCD) includes, among other components, TFTs 106 formed from amorphous silicon (a-Si) or polysilicon (p-Si), electrode wires 104, and electric charge storage capacitances 108, and can be used in the two-dimensional image detector with few modifications in design.

The photoconductive film 112, the dielectric layer 114, and the upper electrode 116 are formed so as to cover a substantial entirety of the active matrix substrate 100.

The photoconductive film 112 is composed of a semiconductor material that produces electric charges (electrons-holes) when exposed to radiation. In the documents cited above, amorphous selenium (hereinafter, will be referred to as a-Se) is employed for use as the photoconductive film 112, since aide material has high dark resistance, exhibits satisfactory photoelectricity when exposed to radiation (X-rays), and is easy to form large films by vapor deposition. Specifically, a-Se is deposited 300 $\mu$m to 600 $\mu$m thick by vacuum vapor deposition to form the photoconductive film 112.

Now, the operation principles of the two-dimensional image detector will be discussed.

When the photoconductive film 112 composed of a-Se is exposed to radiation, electric charges (electrons-holes) develop in the photoconductive film 112. As shown in FIGS. 17 and 18, the upper electrode 116 is electrically connected in series with Cs electrodes 108a in the electric charge storage capacitances 108. Upon application of voltage across the upper electrode 116 and the Cs electrodes 108a, those electrons and holes developing in the photoconductive film 112 move toward the anodes and cathodes, building up electric charges in the electric charge storage capacitances 108.

The electric charges thus accumulated in the electric charge storage capacitance 108 are sent to the amplifier 120 through the data electrode line 104b by changing the TFT 106 into an on-state by means of an input signal from the gate electrode line 104a. Since the electrode wires 104 (the gate electrode lines 104a and the data electrode lines 104b), the TFTs 106, and the electric charge storage capacitances 108 are arranged to form an XY matrix as explained earlier, information on a two-dimensional radiation image is obtainable by sending an input signal sequentially to the gate electrode lines 104a.

If the photoconductive film 1 exhibits photoconductivity to visible or infrared light, as well as in radiation, the two-dimensional image detector can function as a two-dimensional visible or infrared image detector. For example, an a-Se film mentioned above exhibits a satisfactory level of photoconductivity to visible light and avalanche effect on the application of a strong electric field. Studies are under way to develop supersensitive image sensors (two-dimensional image detectors) by means of the avalanche effect In manufacture of the two-dimensional image detector, the three processes A to C below are indispensable following the fabrication so active matrix elements (including the TFTs 106 and the electric charge storage capacitances 108).

A. A-Se Film Deposition Process

In this process, an a-Se film is deposited by means of vacuum vapor deposition on the active matrix substrate 100 so as to cover at least areas in which the active matrix elements are formed.

B. Glass Cutting Process

In this process, a piece of mother glass is cut into the active matrix substrate 100 by a scribe or dicing technology.

Here, mother glass refers to the base material of the piece of glass on which active matrix elements are fabricated. Dividing a piece of mother glass into a designated dimensions will form active matrix substrates 100.

Further, in this process, after active matrix substrates 100 are cut out, the edges along which the active matrix substrate 100 has been cut out are subjected to a chamfering process as necessary.

The glass cutting process is performed after the fabrication of matrix elements for the following reasons. First, the production line for active matrix substrates 100 includes dedicated machines exclusively used for a particular substrate size. Accordingly, the piece of mother glass, after having been subjected to the process to fabricate active matrix elements, needs to be of a size suitable to those dedicated machines. The piece of mother glass thus processed is then divided into smaller pieces of a required size for use as two-dimensional image detectors.

The second reason is that it is difficult in the fabrication process of active matrix elements to fabricate normal active matrix elements near the periphery of a glass substrate. This is chiefly due to the difficulty to satisfy suitable conditions for the fabrication of active matrix elements near the periphery of a glass substrate and the handling assembly directly contacting the periphery of the glass substrate. Therefore, the piece of mother glass needs to be of a size that actually forms the two-dimensional image detectors, plus the periphery. The unnecessary periphery is cut off after the fabrication of active matrix elements.

C. Mounting Process

In this process, various components and circuitry are mounted on the active matrix substrate 100 so as to obtain electric charges and other information from the active matrix substrate 100.

However, regarding a two-dimensional image detector with an a-Se film deposited covering a substantial entirety of the active matrix substrate 100, she following problems occur in its manufacturing process.

It is known that if pollutants in water, air, and the like stick to a typical a-Se film after its deposition, it is likely to change its properties, e.g., crystalize, starring where those foreign objects stick.

Therefore, if an a-Se Film deposition process is followed by a glass cutting process and a mounting process, foreign objects, such as glass particles formed during the cutting process, processing water used for dicing and chamfering, and dust developing during the mounting process, touch the a-Se film and causes deterioration of properties of the a-Se film.

Meanwhile, if a glass cutting process and a mounting process are followed by an a-Se film deposition process, the surface of the active matrix substrates 100 is polluted with the glass particles, processing water, and dust.

Especially, glass particles are hazardous in its possibility of scratching the active matrix elements. They are even so, if they are small and stick to the surface of the active matrix substrate 100, because it is very difficult to remove them with supersonic wave or another similar cleaning technique. In addition, the TFTs 106, forming part of the active matrix element, are very sensitive to pollution. If an a-Se film is deposited on a polluted active matrix element, the a-Se film also becomes polluted, which causes deterioration of properties in both the a-Se film and the active matrix element.

Even after the two-dimensional image detector is completely manufactured, dew drops may develop inside the two-dimensional image detector depending on the environment, causing deterioration in properties of the a-Se film.

In the two-dimensional image detector, an electric field approximately as high as 10V/$\mu$m needs to be applied to the photoconductive film 112 to improve the efficiency in collecting electric charges. For this purpose, a voltage from coupe of thousands to ten thousands volts is applied to the upper electrode 116. Therefore, electric discharge is likely in the vicinity of the upper electrode 116, destructing elements or deteriorating their properties.

SUMMARY OF THE INVENTION

The present invention has an object to prevent deterioration in performance of the a-Se film (semiconductor layer) and the active matrix substrate. For this purpose, methods of manufacturing a two-dimensional image detector are presented whereby the a-Se film and the active matrix substrate are not polluted in the manufacturing process. Also, arrangements of two-dimensional image detectors are presented that can resolve problems in use environments, typically represented by dew drops and electric discharge in the two-dimensional image detector, and that offers a satisfactory level of insusceptibility to environmental conditions.

To achieve the object, a method of manufacturing a two-dimensional image detector in accordance with the present invention is a method of manufacturing a two-dimensional image detector including:

a semiconductor layer for producing electric charges according to incident electromagnetic waves; and a substrate having an active element array for reading out the electric charges produced by the semiconductor layer, the manufacturing method comprising the steps of:
(1) forming the active element array on the substrate;
(2) forming a protection member on the substrate so as to cover an area in which the active element array is formed;
(3) dividing into smaller pieces the substrate on which he protection member is already formed;
(4) removing the protection member from the divided pieces; and
(5) forming the semiconductor layer on the active element array where the protection member is removed.

According to the method, an active element array is formed on a substrate, and then a protection member is formed on the active element array. Subsequently, the substrates divided. After removing the protection member, a semiconductor layer is formed on a surface of the active element array which was protected by the protection member.

As mentioned above, depending on the production line to fabricate substrates (active matrix substrates) with an active element array, sometimes it becomes necessary to divide the substrate into active matrix substrates of a preferred size after the formation of the active element array on the substrate. When the substrate is divided, the substrate comes in contact with materials that can scratch or pollute the active element array (hereinafter, will be collectively referred to as pollutants), such as glass particles and processing water. The same phenomenon happens when the substrate is divided and the divisions are chamfered.

By contrast, in the method, the active element array is covered with a protection member when the substrate is divided. This prevents pollutants produced in the division of the substrate from directly contacting the active element array.

As a result, the active element array can be kept clean and free from scratches, and the deterioration in performance of the active element array can be prevented. As a result, according to the method, active matrix substrates are manufactured with the active element array operating reliably and stably. In addition, the production yields of the active matrix substrates improve.

Besides, the semiconductor layer for converting electromagnetic waves information into electric charges information can be formed on the surface of the active element array that is clean because being exposed by removing the protection member only after dividing the substrate. Therefore, the semiconductor layer can be prevented from contacting pollutants produced in the division of the substrate. Thus, according to the method, the semiconductor layer can be prevented from deteriorating in terms of performance and reliability improves, even when the semiconductor layer is constituted by an a-Se film or other materials that are highly sensitive to pollutants.

As a result, highly reliable two-dimensional image detector can be manufactured with the active element array and the semiconductor layer exhibiting a satisfactory level of performance.

Another method of manufacturing a two-dimensional image detector in accordance with the present invention is a method of manufacturing a two-dimensional image detector including:

a semiconductor layer for producing electric charges according to incident electromagnetic waves; and a substrate having an active element array for reading out the electric charges produced by the semiconductor layer, the manufacturing method preferably comprising the steps of:

(1) forming the active element array on the substrate;
(2) forming the semiconductor layer on the active element array;
(3) forming a protection member on the substrate so as to cover an area in which the semiconductor layer is formed; and
(4) dividing the substrate on which the protection member is already formed.

According to the method, an active element array formed on a substrate, and topped by a semiconductor layer. Then a protection member is formed to cover an area in which the semiconductor layer formed, followed by the division of the substrate.

In the method, the semiconductor layer can be formed on the active element array after the step of forming the active element array, but before any step that produces pollutants.

Therefore, the active element array can be prevented from pollution, and the semiconductor layer can be formed on a clean surface.

Further, according to the method, the substrate is divided with the protection member being provided to cover the area in which the semiconductor layer is formed; therefore, the semiconductor layer can be prevented from being polluted by the aforementioned pollutants during the division of the substrate.

Furthermore, in the method, the step of removing the protection member can be omitted. This reduces the number of steps required in manufacture and leaves the protection member unremoved, providing protection to the semiconductor layer during a late step of mounting circuit components and even after the completion of the two-dimensional image detector. This provides substantially perpetual protection to the semiconductor layer until the two-dimensional image detector is delivered as a finished product.

As a result, two-dimensional image detector having lasting high reliability can be manufactured with the active element array and the semiconductor layer exhibiting a satisfactory level of performance.

Another method of manufacturing a two-dimensional image detector in accordance with the present invention is a method of manufacturing a two-dimensional image detector including:

a semiconductor layer for producing electric charges according to incident electromagnetic waves; and a substrate having an active element array for reading out the electric charges produced by the semiconductor layer, the manufacturing method comprising the steps of:

(1) forming the active element array on the substrate;
(2) forming the semiconductor layer so as to cover the active element array;
(3) forming on the semiconductor layer a surface electrode layer through which a bias voltage is applied to the semiconductor layer;
(4) forming a protection member on the substrate so as to cover the semiconductor layer and the surface electrode layer; and
(5) dividing into smaller pieces the substrate on which the protection member is already formed.

According to the method, an active element array is formed on a substrate, and topped sequentially by a semiconductor layer and a surface electrode layer. Then a protection member is formed on the substrate so as to cover the semiconductor layer and the surface electrode layer. Thereafter, the substrate is divided with the protection member being provided thereon.

Thus, a protection member is formed on the substrate to cover the semiconductor layer and the surface electrode layer, and only subsequently the substrate is divided; therefore, glass particles and processing water produced or used during the division do not directly pollute the semiconductor layer and the surface electrode layer. In other words, the protection member ensures that the semiconductor layer and the surface electrode layer are protected from pollution with glass particles and processing water. Further, the active element array is covered with a semiconductor layer protected by the protection member; therefore, the active element array per se is not polluted by glass particles and processing water.

As a result, the active element array, the semiconductor layer, and the surface electrode layer can be kept clean and free from scratches, and the deterioration in performance of the active element array, the semiconductor layer, and the surface electrode layer can be prevented. As a result, according co the method, highly reliable active matrix substrates are manufactured with the active element array operating stably and the semiconductor layer and the surface electrode layer exhibiting a lasting satisfactory level of performance. So are two-dimensional image detectors in addition, the production yields of the active matrix substrates improve.

A two-dimensional image detector in accordance with the present invention includes:

a substrate;

an active element array provided on the substrate;

a semiconductor layer, provided on the active element array, for producing electric charges according to incident electromagnetic waves so that he electric charges are read out by the active element array; and a protection member, provided on the substrate, for covering the semiconductor layer.

According to the arrangement, a protection member is provided to cover the semiconductor layer on the active element array; therefore, pollutants produced in the use of the two-dimensional image detector can be prevented from directly contacting the active element array and the semiconductor layer. Since the protection member is disposed on the substrate, a minimum area including the active element array and the semiconductor layer can be protected. Therefore, when the two-dimensional image detector is disassembled thoroughly into components for maintenance for example, the active element array and the semiconductor layer are still protected from pollutants.

As a result, highly reliable two-dimensional image detectors can be manufactured with the deterioration in performance of the active element array and the semiconductor layer being effectively prevented even after the manufacturing process.

Further, by providing the protection member so as to cover the semiconductor layer, electric discharge can be prevented from happening around the semiconductor layer even when a high voltage is applied to the semiconductor layer. This protects components from destruction due to electric discharge, as well as prevents the aforementioned pollution and deterioration in performance of the active matrix element and the semiconductor layer. Furthermore, the protection member isolates the semiconductor layer from ambient air, preventing dew drops from developing in, and thus degrading the properties of, the semiconductor layer.

Another two-dimensional image detector in accordance with the present invention includes:
- a substrate;
- an active element array provided on the substrate;
- a semiconductor layer, provided on the active element array, for producing electric charges according to incident electromagnetic waves so that the electric charges are read out by the active element array;
- a surface electrode layer, provided on the semiconductor layer, for allowing a bias voltage to be applied to the semiconductor layer; and
- a protection member, provided on the substrate, for covering the semiconductor layer and the surface electrode layer.

According to the arrangement, a protection member is provided to cover the semiconductor layer and the surface electrode layer on the active element array; therefore, pollutants produced in the use of the two-dimensional image detector can be prevented from directly contacting the active element array, the semiconductor layer, and the surface electrode layer.

Since the protection member is disposed on the substrate, a minimum area including the active element array, the semiconductor layer, and the surface electrode layer can be protected. Therefore, when the two-dimensional image detector is disassembled thoroughly into components for maintenance for example, the active element array, the semiconductor layer, and the surface electrode layer are still protected from pollutants.

As a result, highly reliable two-dimensional image detectors can be manufactured with the deterioration in performance of the active element array, the semiconductor layer, and the surface electrode layer being effectively prevented even after the manufacturing process.

Further, by providing the protection member so as to cover the semiconductor layer and the surface electrode layer, electric discharge can be prevented from happening around the semiconductor layer and the surface electrode layer even when a high voltage is applied to the semiconductor layer via the surface electrode layer. This protects components from destruction due to electric discharge, as well as prevents the aforementioned pollution and deterioration in performance of the active matrix element, the semiconductor layer, and the surface electrode layer. Furthermore, the protection member isolates the semiconductor layer and the surface electrode layer from ambient air, preventing dew crops from developing in, and thus degrading the properties of, the semiconductor layer and the surface electrode layer.

For a fuller understanding of the nature and advantages of the invention, reference should be made to the ensuing detailed description taken in conjunction with the accompanying drawings.

BRIEF DESCRIPTION OF THE DRAWINGS

FIG. 9(a) through FIG. 9(g) are cross-sectional views showing the two-dimensional image detector in those steps described in 8.

FIG. 18 is a cross-sectional view showing a structure of a pixel shown in FIG. 17.

DESCRIPTION OF THE EMBODIMENTS

Embodiment 1

The following description will discuss an embodiment in accordance with the present invention in reference to drawings.

First, referring to FIG. 3 through FIG. 5, a two-dimensional image detector fabricated by manufacturing steps of the present embodiment will be explained.

Figure 3:
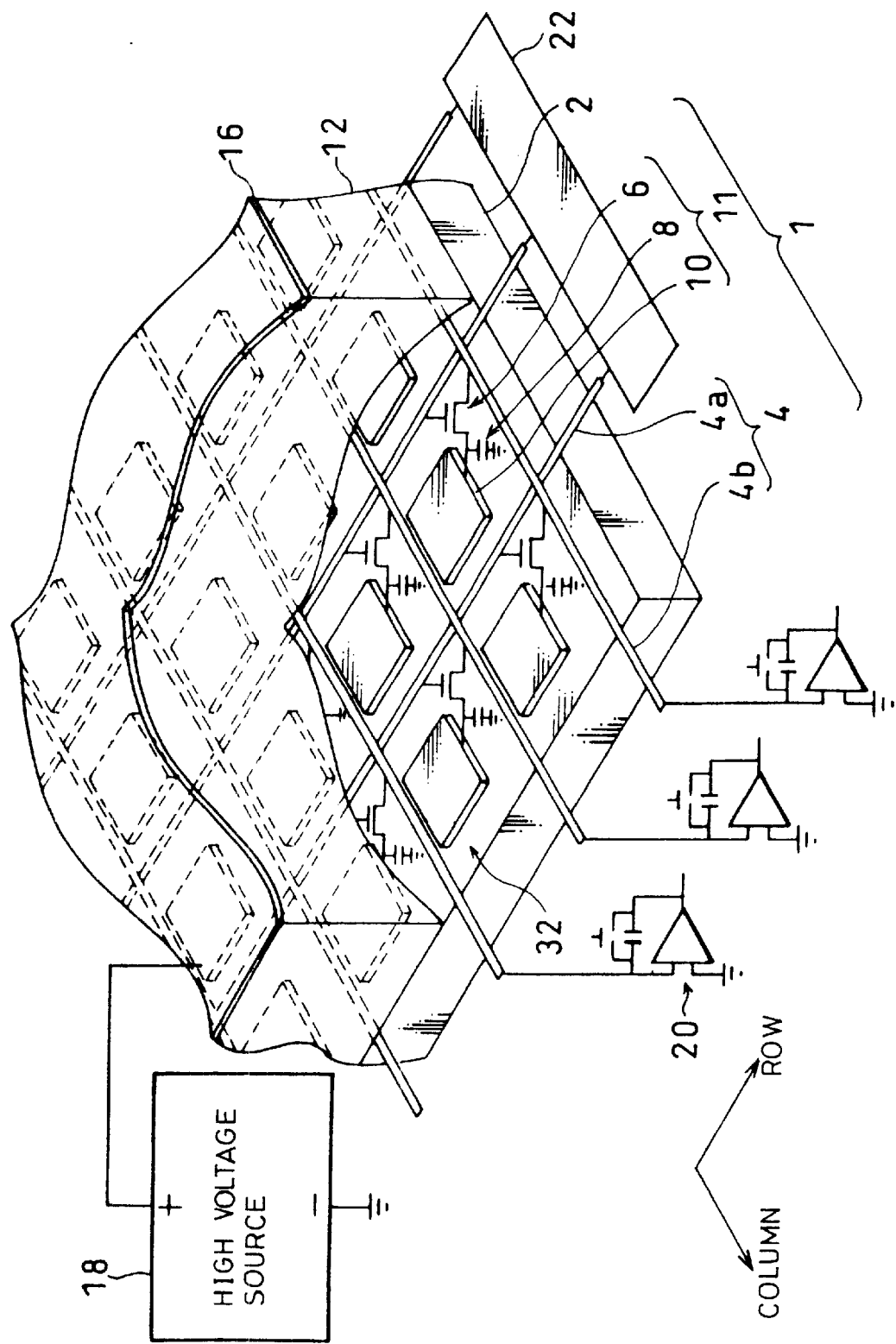
FIG. 3 is a perspective view schematically showing a basic structure of the two-dimensional image detector fabricated by those manufacturing steps of the first embodiment in accordance with the present invention.
Figure 4:
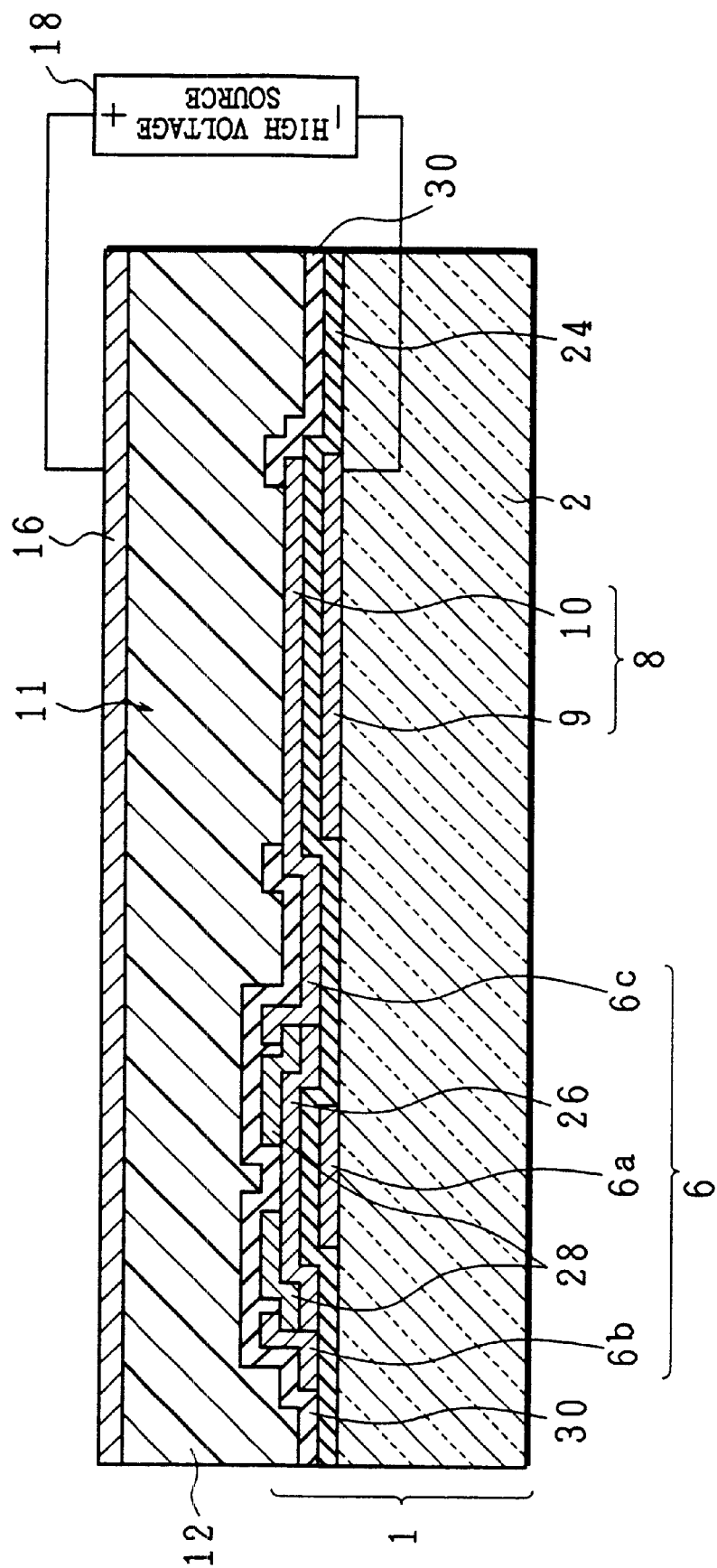
FIG. 4 is a cross-sectional view showing a pixel in the two-dimensional image detector shown in FIG. 3.

FIG. 3 is a perspective view schematically showing a basic structure of a two-dimensional image detector fabricated by manufacturing steps of the present embodiment. The two-dimensional image detector includes an active matrix substrate 1, an X-ray conductive layer (semiconductor layer, photoconductive film) 12, and a surface electrode layer (surface electrode, upper electrode, electrode) 16.

The structure of the active matrix substrate 1 will be explained in the following. The active matrix substrate 1 includes a glass substrate (substrate) 2, electrode wires (gate electrode line 4a and data electrode line 4b) 4 formed the class substrate 2, thin film transistors (hereinafter, will be referred to as TFTs) (active elements) 6 acting as switching elements, electric charge storage capacitances 8, and pixel electrodes 10.

Each pixel 11 is chiefly constituted by a TFT 6, an electric charge storage capacitance 8, and a pixel electrodes 10. The pixels 11 are arranged in a XY matrix (arranged in rows and columns). The TFT 6 is connected at its gate and data electrodes 6a and 6b to the gate and data electrode lines 4a and 4b respectively (see FIG. 4 detailed later). The pixels 11, when arranged to form a XY matrix or other regulated patterns, will be collectively referred to as a TFT array (active element array) 32. Sometimes, the area in which the TFT array 32 is formed will be referred to as an active element formation area.

The gate electrode line 4a extends along the rows of the active matrix substrate 1, being connected at its end to a driver LSI circuit (circuit component) 22, whilst the data electrode line 4b extends along the columns of the active matrix substrate 1, being connected at its end to an amplifier LSI circuit (circuit component) 20.

The surface electrode layer 16 is connected to a high voltage source 18 so as to apply voltage to Cs electrodes 9 detailed later.

Now, referring to FIG. 4, the structure of the pixel 11 will be explained in detail. FIG. 4 is a cross-sectional view showing a pixel 11 in the two-dimensional image detector. The drain electrode 6c of the TFT 6 is extended to form the pixel electrode 10. The pixel electrode 10 is adapted so as to switch to the data electrode 6b of the TFT 6 upon the application of a signal to the gate electrode 6a of the TFT 6 through the gate electrode line 4a (see FIG. 3), that is, to switch electrical connection between the data electrode line 4b (see FIG. 3) and the pixel electrode 10 (see FIG. 3).

Combined with the Cs electrode 9 across a gate insulation film 24, the pixel electrode 10 forms an electric charge storage capacitance 8. The electric charge storage capacitance 8 stores electrode charges from the X-ray conductive layer 12 as image information, when the high voltage source 18 applies voltage across the Cs electrode 9 and the surface electrode layer 16.

The TFT 6 has a structure made up of sequentially deposited thin film, including gate electrodes 6a, a gate insulation film 24, and an amorphous silicon layer (a-Si layer, channel layer) 26. The TFT 6 farther includes data electrodes 6b and drain electrodes 6c deposited on individual contact layers (a-Si (n⁻type) layers) 28 over the common amorphous silicon layer 26.

An insulation protection film 30 is then formed to cover other parts than those on the pixel electrode 10 of the pixel 11 and provide protection to the TFT 6 and other members.

On the entirety of the active matrix substrate 1 except its periphery, there is provided an X-ray conductive layer 12 of, for example, amorphous selenium (hereinafter, will be referred to as a-Se). A surface electrode layer 16 is further provided on the X-ray conductive layer 12.

The two-dimensional image detector was discussed in the foregoing description only in terms or ts basic structure, and in practice may also include other elements. For example, an electric charge prevention layer or a dielectric layer (not shown) may be provided between the electrodes and the X-ray conductive layer 12 to prevent current from leaking through the pixel electrodes 10 and he surface electrode layer 16

Now, the two-dimensional image detector will be discussed in terms or its operation principles in reference to FIGS. 3 and FIG. 4.

As X-rays enter he X-ray conductive layer 12, electric charges (electrons-holes) develop in the X-ray conductive layer 12. The X-ray conductive layer 12 here functions to convert the form of information from electromagnetic wave to electric charges. The developing electrons and holes move toward the anode (toward the surface electrode layer 16 in FIGS. 3 and 4) and the cathodes (toward the Cs electrodes 9 in FIGS. 3 and 4) respectively due to the voltage applied by the high voltage source 18 across the surface electrode layer 16 and the Cs electrodes 9, thereby building up electric charges in the electric charge storage capacitances 8.

The electric charges thus accumulated in the electric charge storage capacitance 8 are sent to the amplifier LSI circuit 20 through the data electrode line 4b by changing the TFT 106 into an on-state by means of an input signal from the driver LSI circuit 22 via the gate electrode lines 4a. Since the electrode wires 4 (the gate electrode lines 4a and the data electrode lines 4b) the TFTs 106, and the electric charge storage capacitances 8 are arranged to form an XY matrix as explained earlier, information on a two-dimensional radiation image is obtainable by sending an input signal sequentially to the gate electrode lines 4a.

The overall arrangement of a two-dimensional image detector including a basic structure as discussed in the foregoing will be explained in reference to FIG. 5, which is a plan view showing the overall arrangement of a two-dimensional image detector fabricated by the manufacturing steps of the present embodiment.

Figure 5:
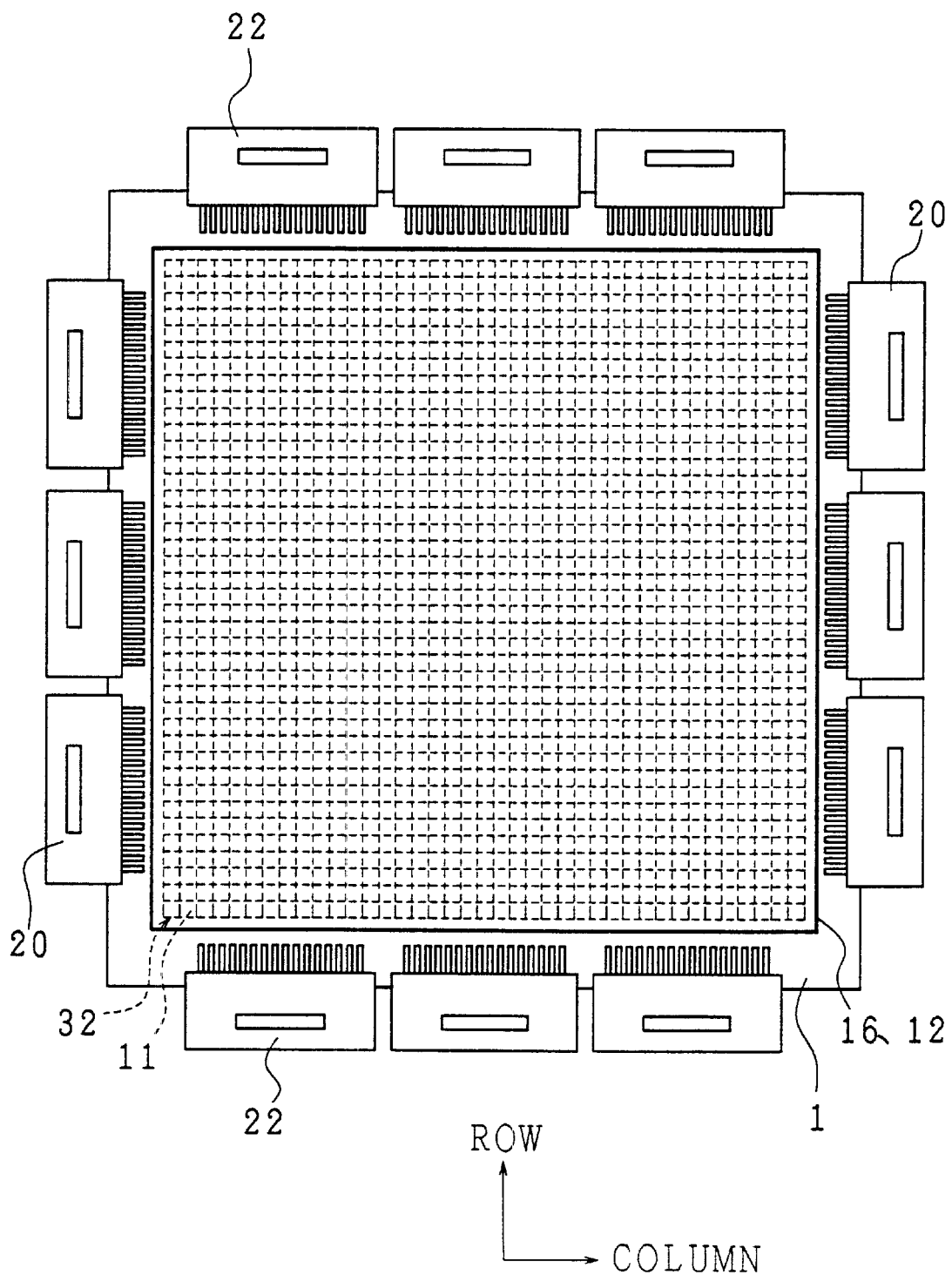
FIG. 5 is a plan view showing an overall arrangement of the two-dimensional image detector shown in FIG. 3.

As shown in FIG. 5, the active matrix substrate 1 includes pixels 11 arranged to form an XY matrix except along the periphery of she active matrix substrate 1. The pixels 11 are covered by an X-ray conductive layer 12 and a surface electrode layer 16. In FIG. 5, each smallest square surrounded by broken lines represents a pixel 11, and the pixels 11 collectively form a TFT array 32. The area surrounded by the thick solid lines indicates where the X-ray conductive layer 12 is provided.

Along the periphery of the active matrix substrate 1 there are provided amplifier LSI circuits 20 and driver LSI circuits 22. The amplifier LSI circuits 20 and the driver LSI circuits 22 are connected to the data electrode lines 4b and the gate electrode lines 4a (see FIG. 3) by TAB (Tape Automated Bonding) or COG (Chip on Glass) technologies. The connection is not shown in FIG. 5. The driver LSI circuits 22 and the amplifier LSI circuits 20 are not fully shown; less than those actually mounted are shown for illustrative purposes only.

Figure 1:
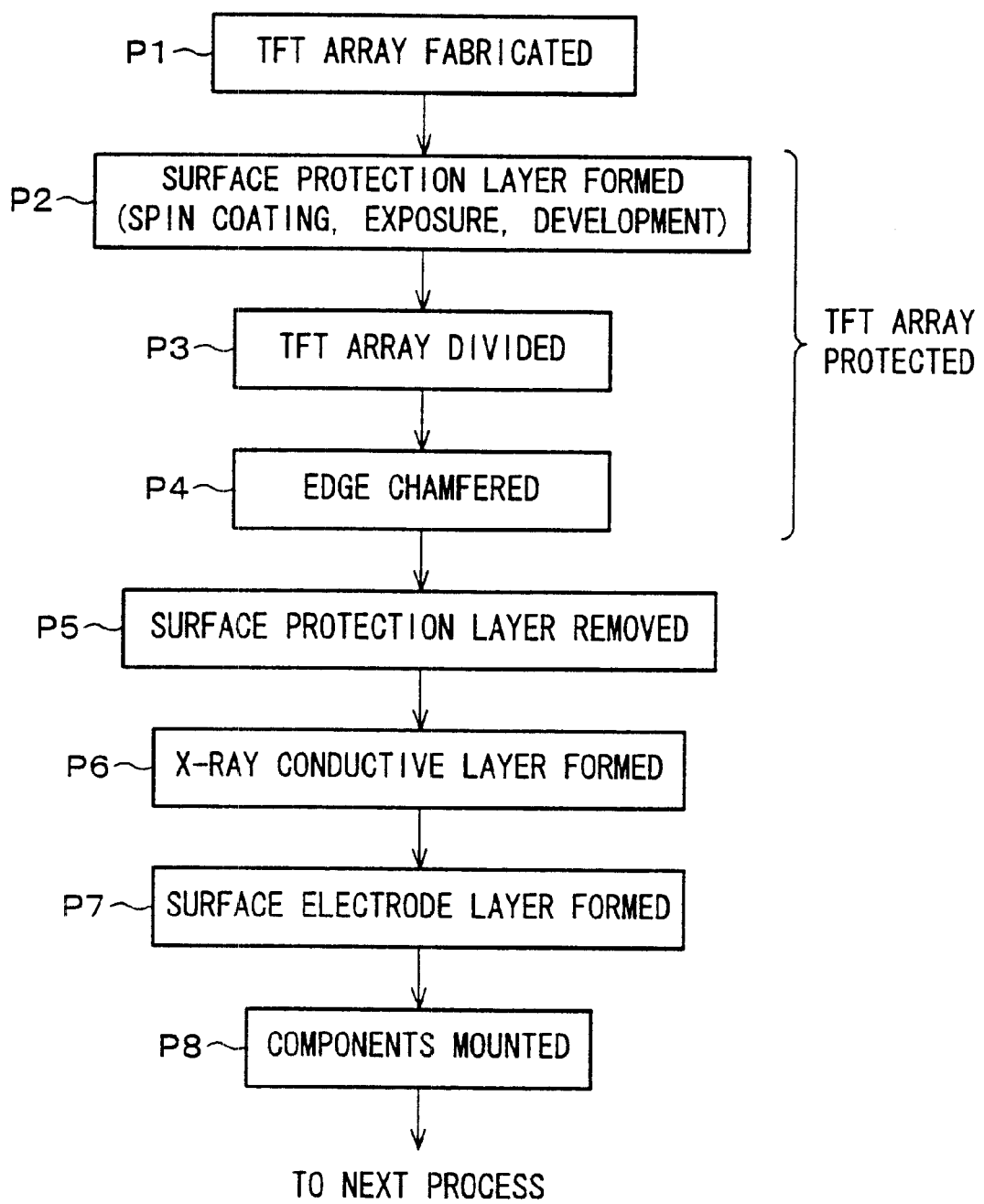
FIG. 1 is a flow chart showing manufacturing steps of a two-dimensional image detector of a first embodiment in accordance with the present invention.

Now, the two-dimensional image detector will be discussed in terms of its manufacturing method in reference to drawings. FIG. 1 is a flow chart showing manufacturing steps for the two-dimensional image detector of the present embodiment. FIG. 2(a) through FIG. 2(h) are cross-sectional views showing the two-dimensional image detector in those steps described in FIG. 1.

As shown in FIG. 1, a manufacturing process for the two-dimensional image detector of the present embodiment includes a TFT array fabrication step (step P1), a surface protection layer formation step (step P2) a TFT array dividing step (step P3), an edge chamfering step (step P4), a surface protection layer removing step (step P5), an X-ray conductive layer formation step (step P6), a surface electrode layer formation step (step P7), and a mounting step (step P8). FIG. 2(a) through FIG. 2(h) shows cross-sections of the two-dimensional image detector in the respective steps. The following description will discuss the individual steps in reference to FIG. 2(a) through FIG. 2(h)

Figure 2:
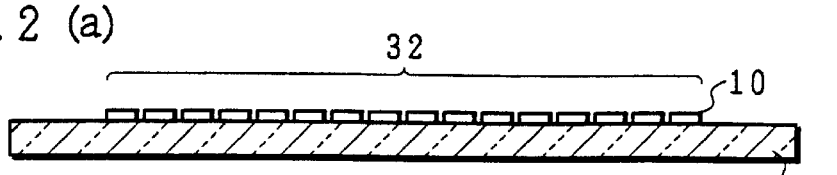
FIG. 2(a) through FIG. 2(h) are cross-sectional views showing the two-dimensional image detector in those steps described in FIG. 1.
Figure 2:
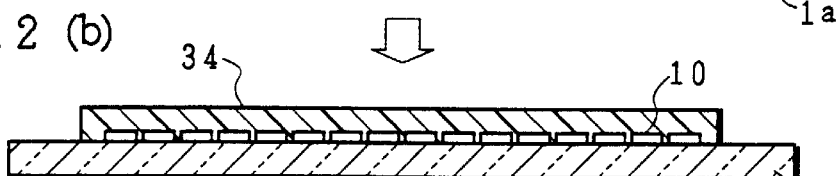
Figure 2:
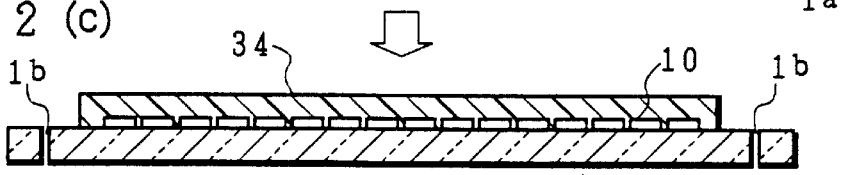
Figure 2:
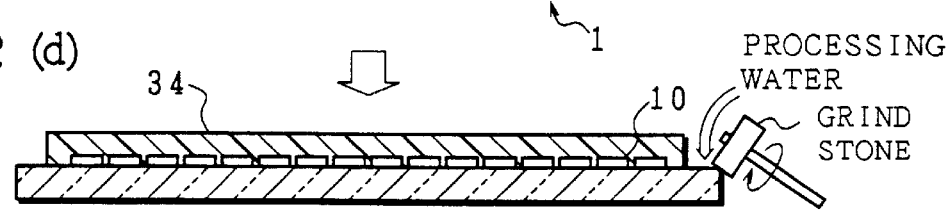
Figure 2:
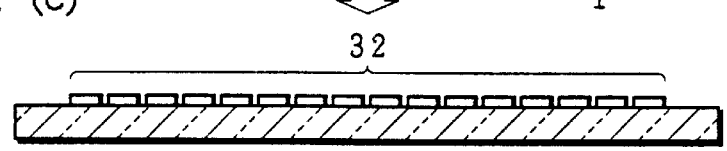
Figure 2:
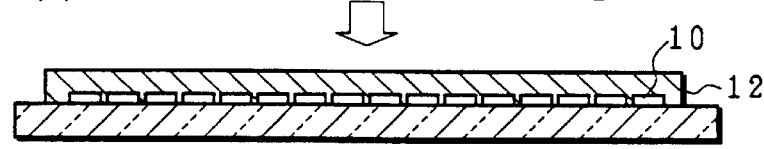
Figure 2:
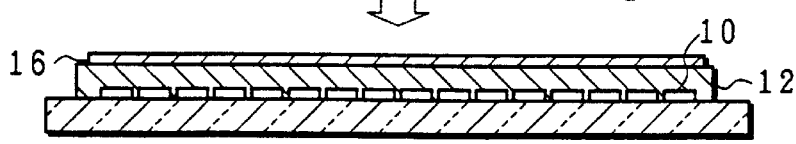
Figure 2:
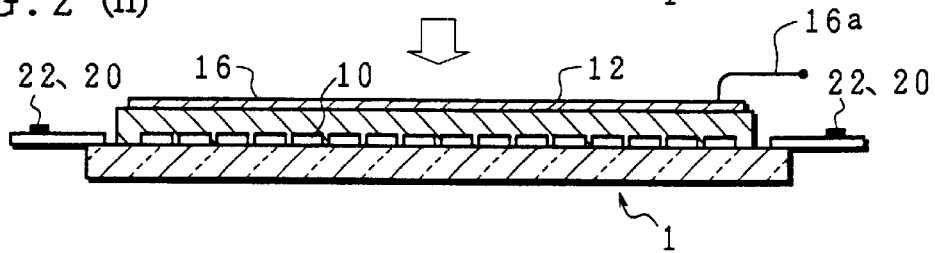

In the TFT array fabrication step (step 1), a TFT array 32 is fabricated on a mother glass substrate (substrate) 1a similarly to a manufacturing step for active matrix liquid crystal displays. Specifically, on the mother glass substrate 1a there are provided electrode wires 4 (gate electrode line 4a data electrode line 4b), TFTs 6 each for a pixel 11, electric charge storage capacitances 8, pixel electrodes 10, etc. (see FIG. 3 or FIG. 4). FIG. 2(a) only shows the mother glass substrate 1a and the pixel electrodes 10 for simple illustration (So do following figures)

Here, the mother glass substrate 1a measures 550 mm ×650 mm×1.1 mm. Typically, the measurement of he mother glass substrate 1a depends on the fabrication device for the TFT array 32, exclusively used for substrates of a particular size. An area of 430 mm×430 mm is reserved to accommodate each TFT array 32, which is decided depending on the image readout area required for the two-dimensional image detector to be manufactured.

The manufacturing method for the TFT array 32 is well known in the art of active matrix liquid crystal displays; specific, detailed description is therefore omitted here.

In the following surface protection layer formation step (step P2), a surface protection layer (protection member) 34 is formed so as to cover the area in which the TFT array 32 is formed on the mother glass substrate 1a. Here, the surface protection layer 34 is made of a photosensitive resin, or more specifically, for example, a photoresist used in photolithography in manufacture of liquid crystal displays and semiconductor devices.

Photoresist is used in the following manner in manufacture of the surface protection layer 34. Photoresist is deposited on the surface of the mother glass substrate 1a with a thickness of about 2 μm by spin coating, and then exposed and developed similarly to ordinary photolithography process to pattern the photoresist.

Here, the pattern of the photoresist is such that there exists photoresist where the TFT array 32 is formed and that there does not exist photoresist near dividing lines 1b along which the mother glass substrate 1a is divided into active matrix substrates 1 of a particular size in the next step (step P3). The photoresist thus provided on the mother glass substrate 1a serves as a surface protection layer 34.

Alternatively to photoresist, the photosensitive resin may be photosensitive acrylic and other resins of both negative and positive types. More specifically, photoresist OFPR (trademark) series are available from Tokyo Ohka Kogyo Co., Ltd and TFR (trademark) series are available from Teijin Ltd.

The foregoing description focused on the method of forming a surface protection layer 34 from a photosensitive resin. Alternatively, the surface protection layer 34 may be formed by other methods as follows.

A first example is printing, which would encompass screen, letterpress, intaglio, and other conventional printing. According to these printing methods, non-photosensitive materials can be applied and patterned simultaneously.

A further alternative is to use an aqueous resin (e.g., aqueous wax) to form a surface protection layer 34. A surface protection layer 34, when composed of an aqueous resin, can be removed in a later step of removing the surface protection layer (step PS), using room-temperature or warm water without special solvent. This alleviates negative effects of solvent of polluting the X-ray conductive layer 12 and the environment.

Aqueous resins may be applied by spin coating similarly to the foregoing. Additionally, if the aqueous resin has thermal plasticity, a conventionally known method may be used whereby the resin is applied while being heated. In any event, if the aqueous resin is not photosensitive, it should be either applied with a tool or the like providing protection to the vicinity of the dividing lines 1b or applied on the entirety of the mother glass substrate 1a and subsequently partly removed near the dividing lines 1b.

In the TFT array dividing step (step P3), the mother glass substrate 1a is divided into active matrix substrates 1 of a predetermined size. The active matrix substrate 1 needs to be large enough to allow the formation of the TFT array 32 (here, 430 mm×430 mm), plus a surrounding area in which drive circuits (amplifier LSI circuits 20, driver LSI circuits 22 as shown in FIG. 5) are mounted here, the active matrix substrate 1 measures 480 mm×480 mm.

The mother glass substrate 1a is cut by a diamond scribe technology. According to a diamond scribe technology, glass or a like material is divided into pieces by applying force to micro cracks that are formed by drawing scribe lines on the surface of the glass, etc. with a diamond blade. Diamond scribe technologies need only inexpensive devices and boast excellent throughput (performance). On the other hand, their drawbacks include likely scattering of broken, small pieces of glass (cullets) when drawing scribe lines.

However, in the present embodiment, the surface protection layer. 34 is provided in the surface protection layer formation step (step P2) so as to cover the area in which the TFT array 32 is formed, effectively preventing small pieces of glass from sticking directly to the surface of the TFT array 32. Hence, the TFT array 32 is protected from pollution and scratches.

Further, in the present embodiment the surface protection layer 34 is deposited and patterned in the surface protection layer formation step (step P2) so that there exists no surface protection layer 34 near the dividing lines 1b. This facilitates drawing scribe lines.

Alternatively to the diamond scribe technology, the mother glass substrate 1a may be divided by dicing using, for example, a diamond blade. According to the method, the cutting process is performed while pouring processing water over portions to be cut. The process therefore entails production of pollutants such as processing water, glass particles due to abrasion, particles due to wearing of the blade. In this method, similarly to the foregoing case, the surface protection layer 34 provides protection to the TFT array 32 from these pollutants.

The edges of the sides of the active matrix substrate 1, along which the substrate 1 was cut off by a diamond scribe or dicing technology, is fragile and easy to break. Preferably, the edges are subjected to chamfering in the next edge chamfering step (step P4).

In the edge chamfering step (step P4), the edges are chamfered. Typically, in a chamfering process, the chamfered portions (edges) are polished using grind stone while pouring processing water to those portions. The present embodiment adopts this method. This process also entails production of pollutants such as processing water, glass particles due to abrasion, particles due to wearing of the blade. In this method also, similarly to the TFT array dividing step (step P3), the surface protection layer 34 provides protection to the TAT array 32 from these pollutants.

Next, in the surface protection layer removing step (step P5), the surface protection layer 34 is removed from the active matrix substrate 1. If the surface protection layer 34 is composed of photoresist, it is preferable to remove the surface protection layer 34 using a dedicated resist removing liquid. Other kinds of organic solvents are also available. If the surface protection layer 34 is composed of aqueous resin, it is removable using room-temperature or warm water; supersonic washing or the use of a jacuzzi would enhance the results.

Next, in the X-ray conductive layer formation step (step P6), an X-ray conductive layer 12 is formed on the active matrix substrate 1. Here, the X-ray conductive layer 12 is formed by depositing an a-Se film by vacuum vapor deposition. The a-Se film is deposited with a thickness of about 500 μm to 1500 μm, so as to cover almost the entirety of the area in which the TFT array 32 is formed.

Here, the surface of the active matrix substrate 1, serving as a bed on which the X-ray conductive layer 12 will be formed, is protected from pollutants, and thus kept clean, by the surface protection layer 34. Therefore, the a-Se film formed thereon has very stable properties.

Next, in the surface electrode layer formation step (step P7), a surface electrode layer 16 is formed on she X-ray conductive layer 12. Here, Au (gold) is deposited with a thickness of about 0.5 μm as the surface electrode layer 16 by vacuum vapor deposition.

Next, in the mounting step (step P8), driver LSI circuits 22 and amplifier LSI circuits 20 are mounted to the periphery of the active matrix substrate 1 by the aforementioned TAB or COG technology. It should be noted that the mounting is performed with the temperature of the active matrix substrate 1 under control so that the heat generated by the process does not increase the temperature so much as to cause the a-Se film, serving as the X-ray conductive layer 12, to crystalize. In the present embodiment, TAB technology is used in the mounting process as an example.

Also, a sensor bias lead 16a for connecting the surface electrode layer 16 to the high voltage source 18 (see FIG. 3) is attached to the surface electrode layer 16.

The two-dimensional image detector thus fabricated subsequently undergoes assembly steps in which the high voltage source 18 (see FIG. 3) and other components will be attached to complete the entire manufacturing process. Description of those subsequent steps is omitted.

Step P6 to step P8 may be executed in a different order from that shown in FIG. 1; namely, in the order of the mounting step (step P8), the X-ray conductive layer formation step (step P6), and the surface electrode layer formation step (step P7).

If the three steps are arranged in the above order, the TFT array 32 is protected by the surface protection layer 34 in the TFT array dividing step (step P3) and the edge chamfering step (step P4); therefore, the TFT array 32 does not get in direct contact with pollutants produced in the steps. This maintains the performance or the TFT array 32 at a satisfactory level and improves the qualities of the X-ray conductive layer 12. As a result, the production yields and reliability of two-dimensional image detectors improve in the manufacturing process or the present embodiment.

In the foregoing description about the present embodiment, two-dimensional image detectors for detecting X-ray images were discussed, and a reference was made to the X-ray conductive layer 12 serving as a photoconductive film. However, the present invention is not limited to this: electromagnetic waves in various wavelength ranges including visible, infrared, and ultraviolet light, as well as X-rays, can be used. To handle electromagnetic waves other than X-rays, the X-ray conductive layer 12 should be adjusted so as to properly handle the target electromagnetic waves.

The a-Se film used above as the X-ray conductive layer 12 exhibits a satisfactory level of photoconductivity to visible light. To take advantage of this characteristic, studies are under way to develop supersensitive image sensors by means of the avalanche effect under high voltage application. The present invention is also effective if used in the manufacture of the supersensitive image sensors.

The aforementioned phenomenon of crystallization (deterioration) of the a-Se film due to pollution or heat is commonly observed among amorphous materials, although crystallization temperature may differ from material to material. Therefore, the present invention is effective with a photoconductive film made of amorphous Si, amorphous SiC, amorhous SiGe to name a few.

Further, in the foregoing description, manufacture of two-dimensional image detectors including an X-ray conductive layer 12 was discussed; however, the steps preceding the formation of the X-ray conductive layer 12 are identical to the steps of manufacturing the active matrix substrate 1. Therefore, besides two-dimensional image detectors, the present invention is further applicable to manufacturing steps for devices incorporating an active matrix substrate 1, for example, liquid crystal displays.

Modification Example

Figure 6:
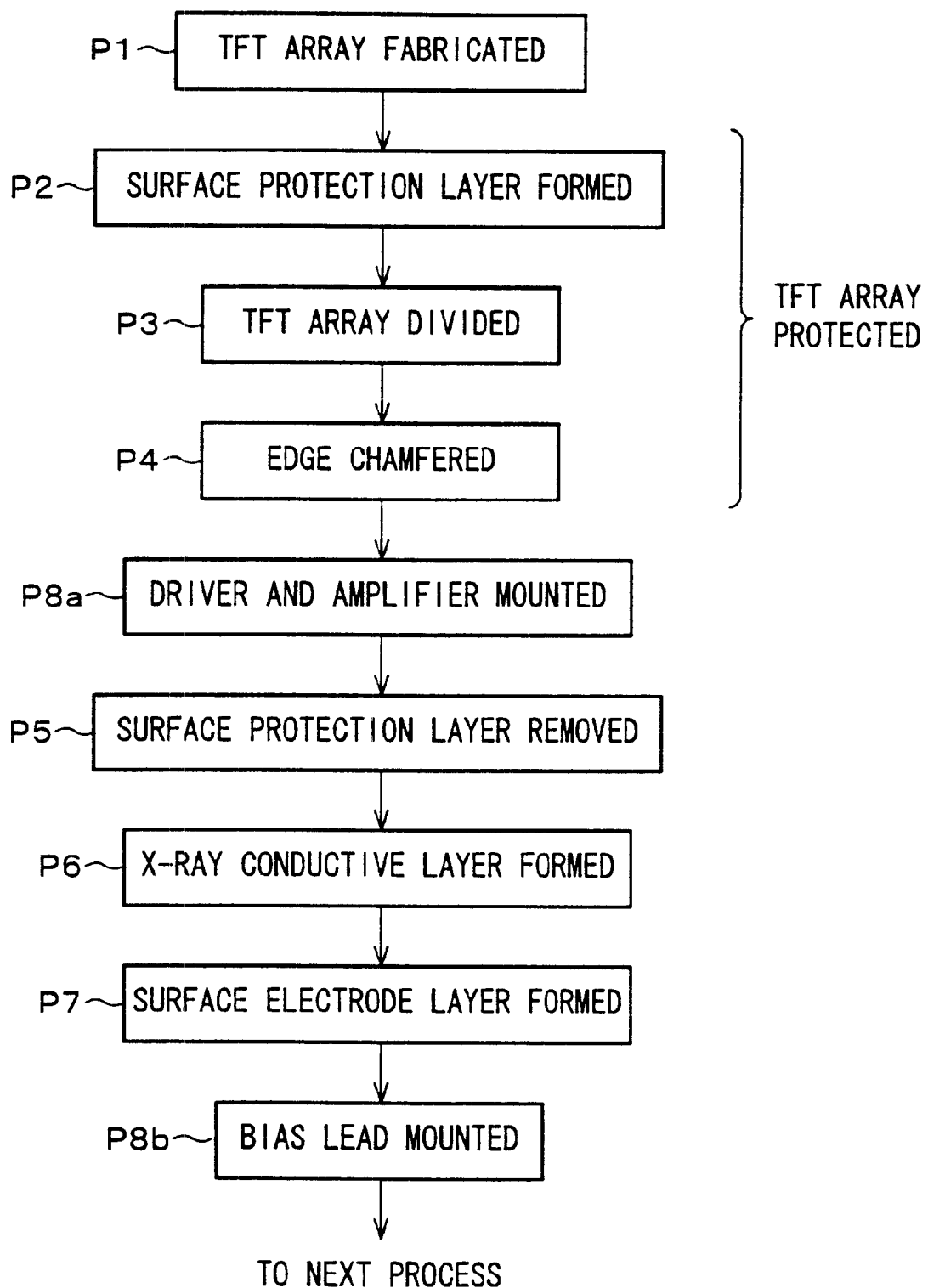
FIG. 6 is a flow chart showing manufacturing steps of another two-dimensional image detector of the first embodiment in accordance with the present invention.
Figure 7:
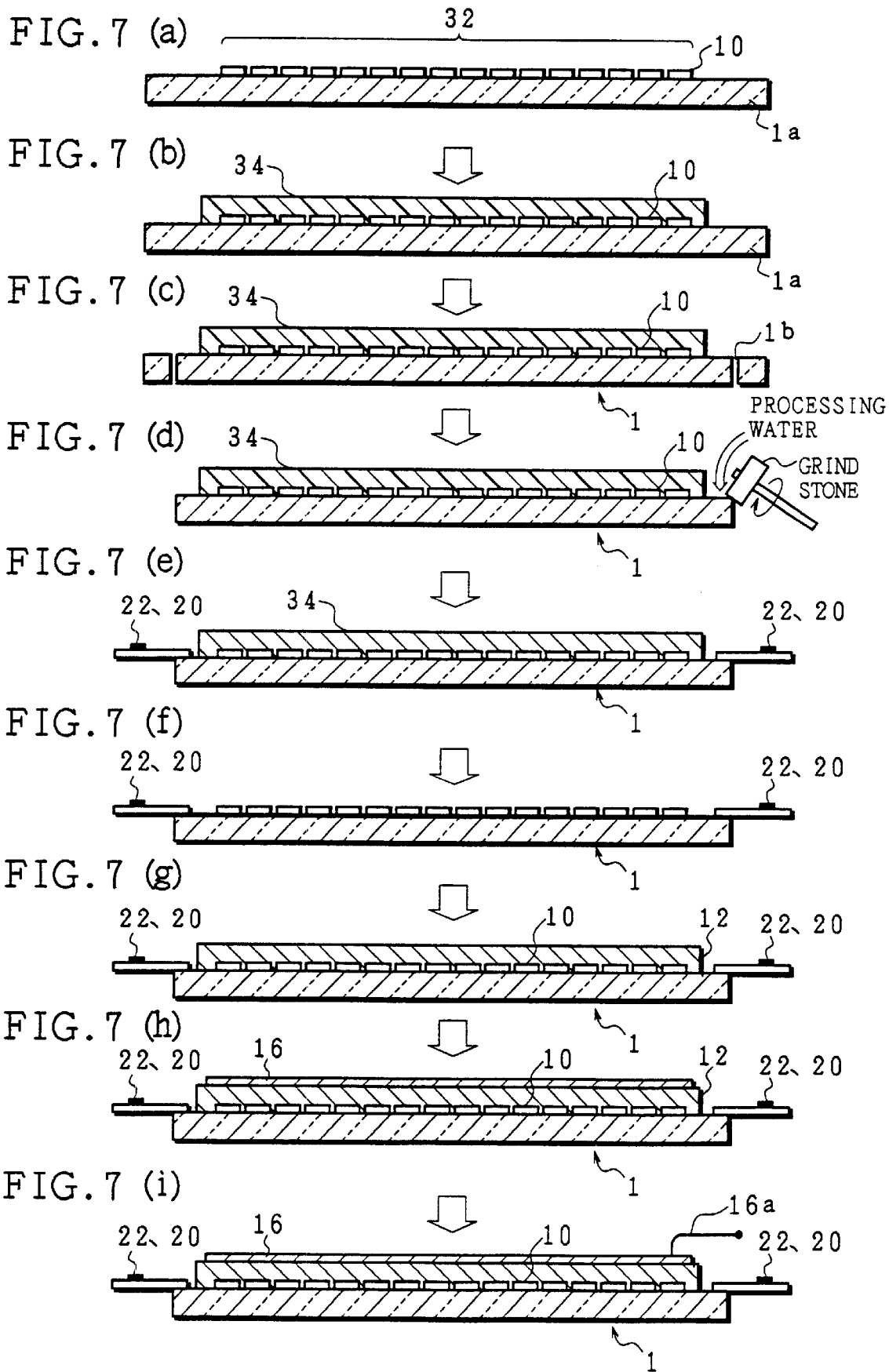
FIG. 7(a) through FIG. 7(i) are cross-sectional views showing the two-dimensional image detector in those steps described in FIG. 6.

Now, referring to drawings, the following description will discuss a modification example of the present embodiment. FIG. 6 is a flow chart showing the manufacturing steps in sequence for a two-dimensional image detector of the present modification example. FIG. 7(a) through FIG. 7(i) are cross-sectional views showing the two-dimensional image detector in those steps described in FIG. 6.

As shown in FIG. 6, in accordance with the present modification example, the manufacturing stews or a two-dimensional image detector include a TFT array fabrication step (step P1), a surface protection layer formation step (step P2), a TFT array dividing step (step P3), an edge chamfering step (step P4), a driver and amplifier mounting step (step P8a), a surface protection layer removing step (step P5), an X-ray conductive layer formation step (step P6), a surface electrode layer formation step (step P7), and a bias lead mounting step (step P8b).

FIG. 7(a) through FIG. 7(i) show cross sections of the two-dimensional image detector in the respective steps. The following description will discuss the individual steps in reference to corresponding FIG. 7(a) through FIG. 7(i). Here, for convenience, the steps that are essentially identical to the steps discussed above are indicated by the same reference numerals and description thereof is omitted.

In the present modification example, the mounting step (step P8) discussed above will be divided into two steps, that is, a driver and amplifier mounting step (step P8a) and a bias lead mounting step (step P8b). The driver and amplifier mounting step (step P8a) is executed between the edge chamfering step (step P4) and the surface protection layer removing step (step P5).

Specifically, the driver LSI circuits 22 and the amplifier LSI circuits 20 are mounted (driver and amplifier mounting step (step P8a)) immediately after completing the edge chamfering step (step P4), before removing the surface protection layer 34 covering the TFT array 32. The circuits are mounted in the same manner as in the foregoing case.

Here, mounting the driver LSI circuits 22 and the amplifier LSI circuits 20 entails attachment by means of heat, for example, anisotropic conductive connection using an AC (anisotropic conductive film) or wire bonding connection using solder. Pollutant gases and dust may be produced in the processes and pollute the TFT array 32 and the X-ray conductive layer 12. However, in the present modification example, when driver LSI circuits 22 and the amplifier LSI circuits 20 are mounted, the TFT array 32 is protected by the surface protection layer 34, and the X-ray conductive layer 12 is yet to be formed. Therefore the TFT array 32 and the X-ray conductive layer 12 are not polluted.

After mounting the driver LSI circuits 22 and the amplifier LSI circuit 20, the surface protection layer 34 is removed in the surface protection layer removing seep (step P5). The process then proceeds to the X-ray conductive layer formation step (step P6) and the surface electrode layer formation step (step P7).

The surface electrode layer 16 is formed in the surface electrode layer formation step (step P7), and thereafter a sensor bias lead 16a is attached to the surface electrode layer 16 in the bias lead mounting step (step P8b).

In the foregoing process, the TFT array 32 is protected by the surface protection layer 34 in the driver and amplifier mounting step (step P8a), as wells as in the TFT array dividing step (step P3) and in the edge chamfering step (step P4). The X-ray conductive layer 12 is formed after completing these steps. Hence, the TFT array 32 and the X-ray conductive layer 12 do not get in direct contact with the pollutants produced in these steps.

This better maintains the performance of the TFT array 32 at a satisfactory level, and further improves the qualities of the X-ray conductive layer 12. As a result, the production yields and reliability of two-dimensional image detectors improve in the manufacturing process of the modification example.

In the foregoing process, the driver and amplifier mounting step (step P8a) is executed before the X-ray conductive layer formation step (step P6); there ore, heat treatment during mounting the drivers and amplifiers would not negatively affect the X-ray conductive latter 12.

Embodiment 2

Referring to drawings, the following description will discuss another embodiment in accordance with the present invention. Here, for convenience, members of the present embodiment that have the same arrangement and function as members of embodiment 1 are indicated by the same reference numerals and description thereof is omitted.

Figure 8:
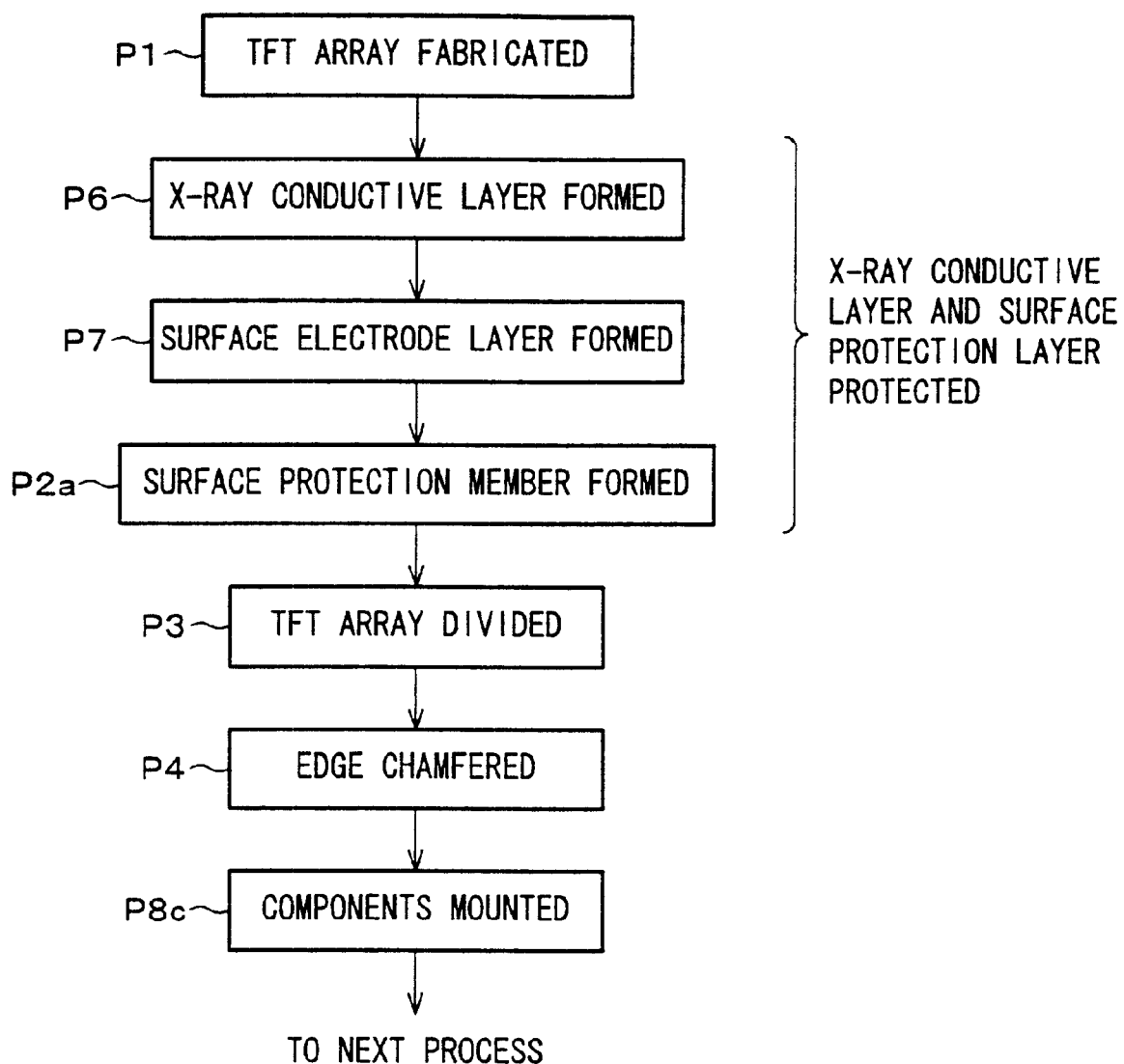
FIG. 8 is a flow chart showing manufacturing steps of a two-dimensional image detector of a second embodiment in accordance with the present invention.

FIG. 8 is a flow chart showing the manufacturing steps in sequence for a two-dimensional image detector of the present embodiment. FIG. 9(a) through FIG. 9(g) are cross-sectional views showing the two-dimensional image detector in those steps described in FIG. 3.

As shown in FIG. 8, in accordance with the present embodiment, the manufacturing steps for the two-dimensional image detector include a TFT array fabrication step (step P1), an X-ray conductive layer formation step (step P6), a surface electrode layer formation step (step P7), a surface protection member formation step (step P2a), a TFT array dividing step (step P3), an edge chamfering seep (step P4), and a mounting step (step P8c).

FIG. 9(a) through FIG. 9(g) show cross sections of the two-dimensional image detector in the respective steps. The following description will discuss the individual steps in reference to corresponding FIG. 9(a) through FIG. 9(g). Here, for convenience, the steps identical to the steps discussed in embodiment 1 are indicated by the same reference numerals and description thereof is partly omitted.

First, a TFT array 32 is formed on the mother glass substrate 1a in the TFT array fabrication step (step P1).

Next, an a-Se film is formed as an X-ray conductive layer 12 in the X-ray conductive layer formation step (step P6), Here, since the X-ray conductive layer 12 is formed immediately after the formation of the TFT array 32 on the mother glass substrate 1a, there is little likelihood for the surface of the TFT array 32 serving as a bed on which the X-ray conductive layer 12 is formed to be polluted. Therefore, the TFT array 32 is not polluted, and the X-ray conductive layer 12 manufactured has a satisfactory level of quality, enabling the TFT array 32 and the X-ray conductive layer 12 fabricated to show very stable performance.

Next, in the surface electrode layer formation step (step P7), a surface electrode layer 16 is formed on the X-ray conductive layer 12.

Next, in the surface protection member formation step (step P2a), a surface protection member (protection member) 35 is provided in place of surface protection layer 34 (see FIG. 2(b) through FIG. 2(d)) of embodiment 1. The surface protection member 35 is constituted by a protection glass plate 35a, a sealant (connecting member) 35b, and a sealing tape 3c.

The surface protection member 35 proves protection to the X-ray conductive layer 12 and the surface electrode layer 16 in the following manner.

First, a sealant 35b is provided surrounding the X-ray conductive layer 12 along the circumference of an area in which the X-ray conductive layer 12 is provided on the mother glass substrate 1a. The sealant 35b suitably establishes satisfactory adhesion between the mother glass substrate 1a and the protection glass plate 35a and cures without thermally affecting the a-Se film. Preferred examples of such a sealant 35b include light-curing glues and silicon sealants.

A protection glass plate 35a, cleaned beforehand, is disposed opposite to the mother glass substrate 1a, sandwiching the sealant 35b so as to cover the X-ray conductive layer 12 and the surface electrode layer 16. The protection glass plate 35a here is 0.7 mm thick.

If the protection glass plate 35 and the mother glass substrate 1a are made of the same material as in the foregoing and thus share an equal coefficient of thermal expansion, even when they are secured, the substrate does not warp due to difference in thermal expansion. The protection glass plate 35a may be replaced by a sheet of PET (polyethylene terepht-halate) or another similar resin.

The protection glass plate 35a is provided with a through hole 35d through which a sensor bias lead 16a is mounted later. The through hole 35d is sealed in advance with a sealing tape 35c. Alternatively, the through hole 35d may be formed on the mother glass substrate 1a after the provision of the sealant 35b on the protection glass plate 35a.

Here, the gaps between the sealant 35b and the mother glass substrate 1a, between the sealant 33b and the protection glass plate 35a, and between the sealing tape 35c and the protection glass plate 35a are hermetically sealed. The sealing prevents processing water and glass particles used or produced in a later step from sneaking into the surface protection member 35, and provides protection to the X-ray conductive layer 12 and the surface electrode layer 16 from pollutants.

Next, in the TFT array dividing step (step P3), the mother glass substrate 1a is divided into active matrix substrates 1 of a predetermined size. Then, in the edge chamfering step (step P4), the sides of the active matrix substrate 1, along which the substrate 1 was cut off, are chamfered.

Here, as detailed in embodiment 1, either diamond scribe or dicing using a diamond blade is carried out, following by polishing using a grind stone. The active matrix substrate 1 directly contacts pollutants, such as glass particles and processing water produced or used in the process, as discussed in the foregoing; however, in the present embodiment, the surface protection member 35 protects the X-ray conductive layer 12 and the surface electrode layer 16 from pollution or scratches similarly to embodiment 1.

Next, in the mounting step (step P8c), the driver LSI circuits 22, the amplifier LSI circuits 20, and the sensor bias lead 16a are mounted. The driver LSI circuits 22 and amplifier LSI circuits 20 are mounted in the same manner as in the mounting step (step P8) in embodiment 1, whilst the sensor bias lead 16a is connected to the surface electrode layer 16 at one end through a through hole 35d opened by peeling the sealing tape 35c off the protection glass plate 35a, and extends externally at the other end.

The driver LSI circuits 22 and amplifier LSI circuits 20 are preferably mounted while the through hole 35d is sealed by the sealing tape 35c. This prevents, similarly to the modified example of embodiment 1, pollution of the X-ray conductive layer 12 and the surface electrode layer 16 during mounting the driver LSI circuits 22 and the amplifier LSI circuits 20.

Figure 10:
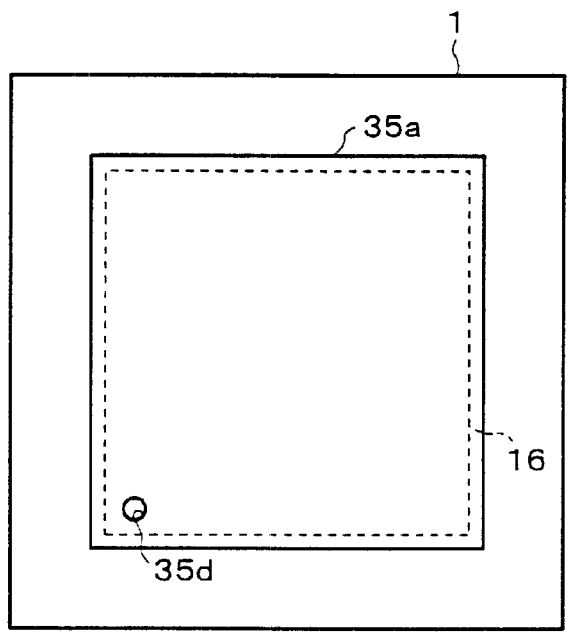
FIG. 10(a) is a plan view showing a through hole provided in a protection glass plate.
FIG. 10(b) is a plan view showing a notch provided to a protection glass plate.
Figure 10:
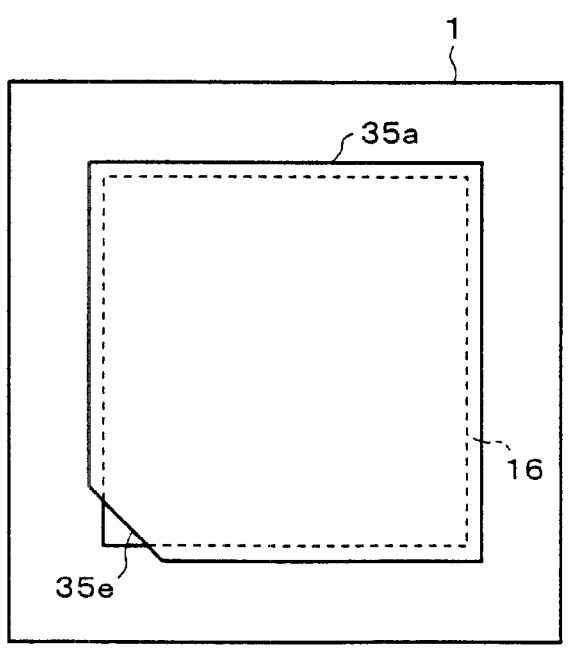

FIG. 10(a) is a top view, as seen oppositely from the mother glass substrate 1a across the protection glass plate 35a in FIG. 9(d), showing the through hole 35d provided in the protection glass plate 35a through which the sensor bias lead 15a extends externally. Alternatively, for example, as shown in the plan view constituting FIG. 10(b), a notch 35e may be provided in a corner or along a periphery of the protection glass plate 35a in advance, to expose a part of the surface electrode layer 16, where the sensor bias lead 16a is mounted.

Figure 11:
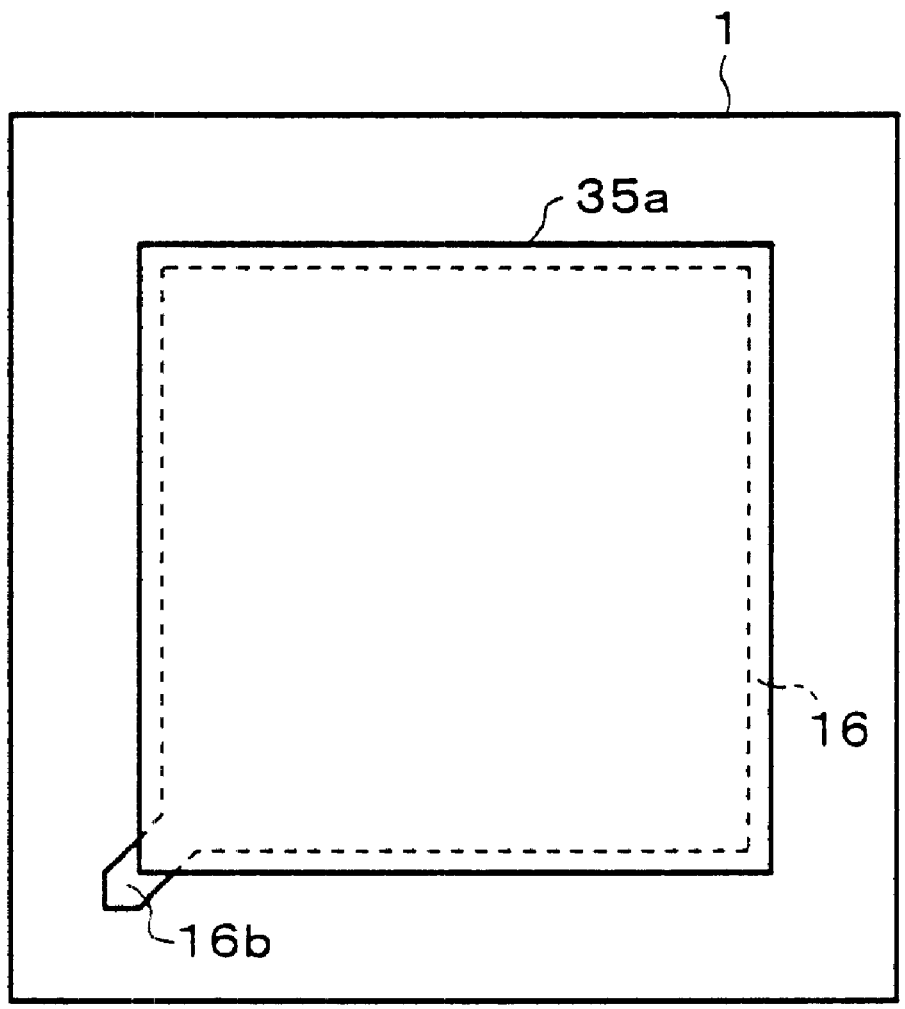
FIG. 11 is a plan view showing a surface electrode pull-out holder provided to a surface electrode layer.

A further alternative is shown in FIG. 11, in which neither a through hole 35d nor a notch 35e is provided in the protection glass plate 35a. Instead, a surface electrode pull-out holder 16b may be formed by partly extending the surface electrode layer 16 to provide external access to the protection glass plate 35a.

The through hole 35d, notch 35e, or surface electrode pull-out holder 16b, since required to be located outside areas where the driver LSI circuits 22 and the amplifier LSI circuits 20 for the active matrix substrate 1 are disposed, is preferably disposed in a corner of the protection glass place 35a or its corresponding part of the surface electrode layer 16. Through holes 35d or notches 35e may be provided in plurality, for example, in all the four corners or two diagonally opposing corners of the protection glass plate 35a.

Similarly, surface electrode pull-out holders 16b may be provided in plurality extending from the surface electrode layer 16.

The provision of the through hole 35d or notch 35e in the protection glass plate 35a or the surface electrode pull-out holder 16b extending from the surface electrode layer 16 facilitates the mounting of the sensor bias lead 16a. The provision further facilitates the application of a bias voltage to the surface electrode layer 16 via the through hole 35d, notch 35e, or surface electrode pull-out holder 16b, even with the protection glass plate 35a being provided above the mother glass substrate 1a.

Preferably, the inside of the surface protection member 35 (the space defined by the surface protection member 35 and the active matrix substrate 1) is filled with an electrically insulating material by using the sealant 35b again after the mounting step (step P8c).

Preferred examples of electrically insulating materials include insulating gases, such as $N_2$; and electrically insulating materials, such as silicon oil KF96 manufactured by Shin-Etsu Chemical Co., Ltd and inactive liquid Florinate FC-40 manufactured by Sumitomo 3M Ltd.

The arrangement can prevent a high voltage across the surface electrode layer 16 and the Cs electrodes 9 (see FIG. 4) from causing electric discharge. The arrangement can also prevent ambient moisture from forming dew drops and polluting the X-ray conductive layer 12 and the TFT array 32, and improve insusceptibility of the two-dimensional image detector to environment conditions.

Figure 12:
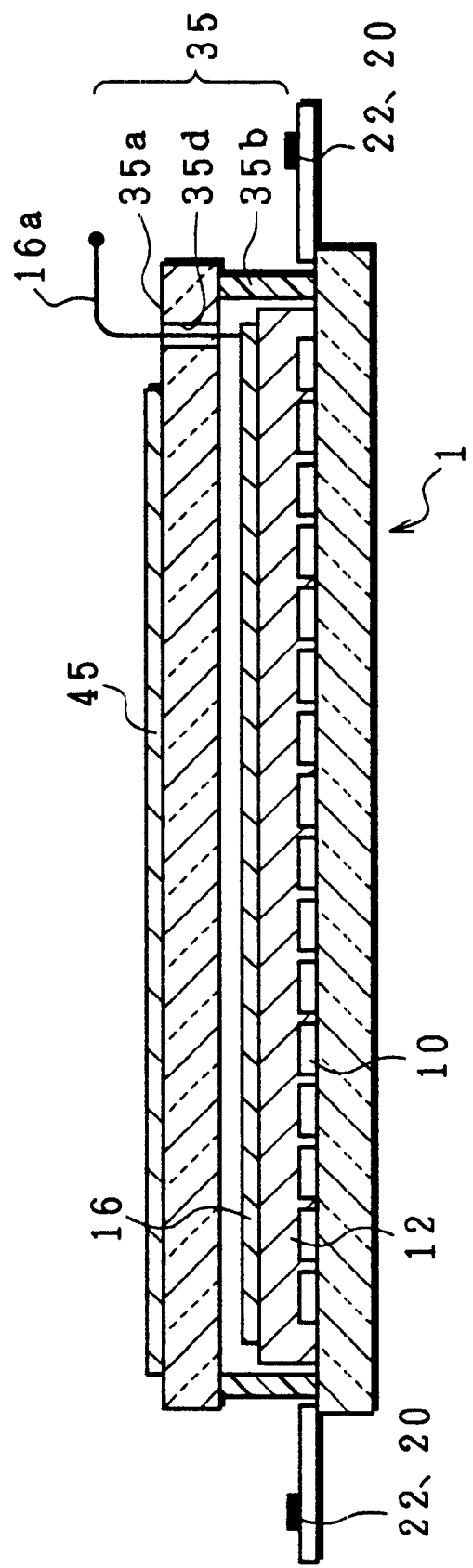
FIG. 12 is a cross-sectional view schematically showing a structure of an active matrix substrate (two-dimensional image detector) such that the protection glass plate includes a metal film.

An Al, Ni, or another metal film 45 may be provided, as shown in FIG. 12, on the substantial entirety of the external surface of the protection glass plate 35a (opposite the surface of the protection glass plate 35a facing the X-ray conductive layer 12). The metal film 45 thus provided improves on electric shield and light shelter of the two-dimensional image detector, and prevents a high voltage application from causing a build-up of static electricity.

In the TFT array dividing step (step P3), the edge chamfering step (step P4), and the mounting step (step P8c) among the above steps, the TFT array 32 and the X-ray conductive layer 12 are protected by the surface protection member 35. Therefore, in these steps, pollutants produced can be prevented from directly contacting the TFT array 32 and the X-ray conductive layer 12, which maintains the performance of the TFT array 32 at a satisfactory level and improves the qualities of the X-ray conductive layer 12. As a result, the production yields and reliability of two-dimensional image detectors improve.

The surface protection member 35 may be formed after the two-dimensional image detector is completely fabricated, to provide substantially perpetual protection to the area where the X-ray conductive layer 12 is formed and to preventing to some degree electric discharge and dew drops from developing inside the surface protection member 35. This further improves the reliability and insusceptibility of the two-dimensional image detector to environmental conditions.

In addition, the surface protection member 35 is disposed on the active matrix substrate 1; therefore, the surface protection member 35 provides protection to a minimum area including the TFT array 32 and the X-ray conductive layer 12. Therefore, when the two-dimensional image detector is disassembled thoroughly into components for maintenance for example, the TFT array 32 and the X-ray conductive layer 12 are still protected from pollutants.

In the description so far, the surface protection member 35 was constituted by a protection glass plate 35a by way of example; however, a ceramic substrate or a resin sheet (plate) may be used in place of the protection glass plate 35a. The use of a solid substrate composed of a ceramic substrate (including glass substrate) is advantageous in that the substrate in which the active element array is provided is reinforced. Meanwhile, the use of a solid substrate composed of a resin sheet (plate) is advantageous in that the substrate becomes easy to fabricate, which facilitates the formation of the through hole and notch, and also in that the smaller weight of the substrate than a ceramic substrate allows a reduction in the weight of the two-dimensional image detector.

The alternative member to the protection glass plate 35a is preferably composed of material that does not interfere with incident X-rays into the X-ray conductive layer 12. A preferred example of such a ceramic substrate is composed of one of the ceramic materials consisting of aluminum oxide, aluminum nitride, boron nitride, silicon oxide, silicon nitride, and silicon carbide. The ceramic substrates absorb only limited amounts of X-rays; therefore the use of the ceramic substrates does not cause a significant drop in the sensitivity of the two-dimensional image detector. By contrast, a ceramic substrate containing a relatively large proportion of an element of a large atomic number, such as Ba, Pb, or Sn, absorbs large portions of X-rays and likely to degrades the sensitivity of the two-dimensional image detector.

If two or more of the foregoing ceramic materials are used in mixture, the coefficient of thermal expansion of the ceramic substrate can be arbitrarily adjusted by changing the ratio of the mixture. Accordingly, a ceramic substrate can be fabricated with a coefficient of thermal expansion substantially equal to that of the substrate on which the active element array is formed. The ceramic substrate does not warp due to a difference in coefficients of thermal expansion even when both the substrates (the ceramic substrate and the substrate on which the active element array is formed) are secured.

A resin sheet (plate) will absorb only limited amounts of X-rays and hardly degrade the sensitivity of the two-dimensional image detector. Especially, if the sheet (plate) is made of a resin material containing no Si, these advantages are enhanced. Such resin materials containing no Si include acrylic resins, polycarbonate (PC), polyethylene terephthalate (PET), polystyrene, polyimide, polyvinyl chloride resin, nylon, BS resins, polyethylene, polypropylene. For example, to compare the ceramic substrate with the resin sheet in terms or absorption of X-rays, if both the substrates are 1 mm thick, the ceramic substrate absorbs an average of about 10% of X-rays, while the resin sheet (plate) absorbs an much lower average of about 3%. Further, the resin sheet can be fabricated with such a small thickness that the sheet becomes flexible, which is useful in allowing a further reduction in the absorption of X-rays.

For the reasons laid out above, the surface protection member 35 is composed of a material that does not interfere with incident X-rays into the X-ray conductive layer 12. In the description that follows, the same member(s) as in the description above is(are) provided on the X-ray conductive layer 12 after the completion of the two-dimensional image detector.

Figure 13:
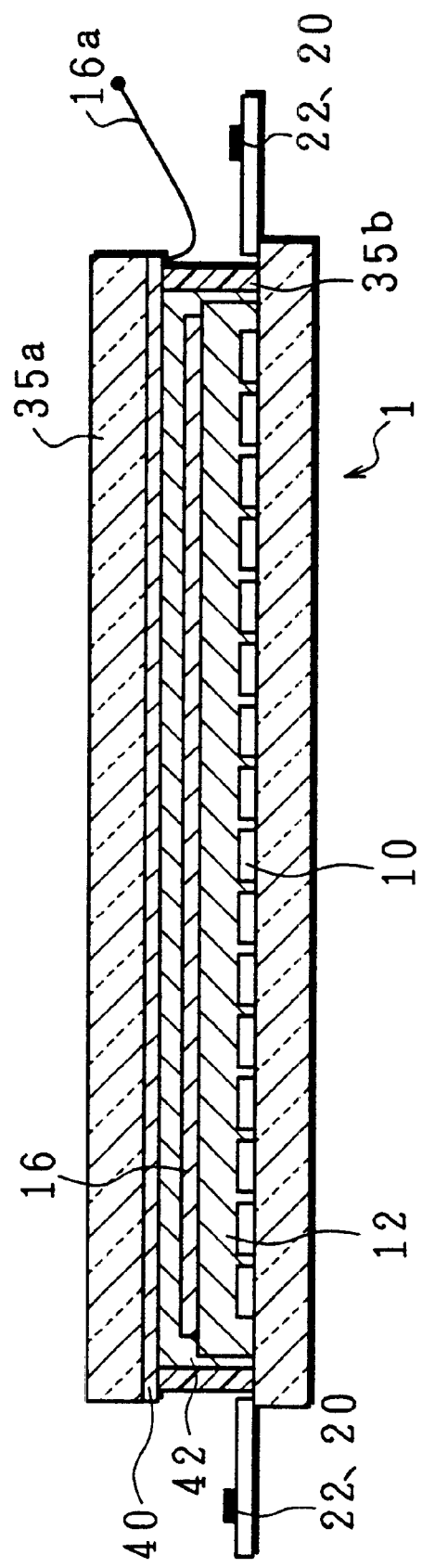
FIG. 13 is a cross-sectional view showing a two-dimensional image detector fabricated by manufacturing steps modified based on those manufacturing steps described in FIG. 8.

If there is a surface protection member 35 provided in a two-dimensional image detector in the foregoing manner, electricity may be supplied to the surface electrode layer 16 in a different manner as shown in FIG. 13. FIG. 13 is a cross-sectional view showing a two-dimensional image detector, which is an application of the manufacturing steps for two-dimensional image detectors of the present embodiment.

The two-dimensional image detector includes a conductive layer 40 provided on a surface of the protection glass plate 35a facing the surface electrode layer 16, and a conductive material (conductive member) 42 is filling the space between the protection glass plate 35a and the surface electrode layer 16. A sensor bias lead 16a is connected to the conductive layer 40 where there are no X-rays entering the X-ray conductive layer 12 (for example, as shown in FIG. 13, parts of the protection glass plate 35a not facing the X-ray conductive layer 121.

The structure provides alternative mounting positions for the sensor bias lead 15a through which electricity is fed to the surface electrode layer 16 which in turn applies an electric field across the X-ray conductive layer 12. Thus, the sensor bias lead 16a does not exist in the paths of incoming X-rays, does not cast a shadow in the produced X-ray image, effectively improving the image quality.

The existence of the conductive material 42 causes the vicinity of the X-ray conductive layer 12 to have an identical potential, and thus can prevent electric charge from occurring around the X-ray conductive layer 12, similarly to the case where a electrical insulating material is filling the gap between the protection glass plate 35a and the surface electrode layer 16.

To fabricate such a two-dimensional image detector, a protection glass plate 35a including a prefabricated conductive layer 40 on one of its surfaces should be used in the aforementioned step, and the conductive material 42 should be positioned in the gap between the surface electrode layer 16 and the conductive layer 40 in the surface protection member formation step (step P2a) followed by establishing connection of the sensor bias lead 16a at the aforementioned position in the mounting step (step P8c). The conductive material 42 is preferably a conductive rubber sheet, a conductive adhesive sheet, a conductive paste, a conductive glue, and the like. Especially preferred among these are materials containing carbon as a conductive pigment, because carbon absorbs relatively small amounts of X-rays. Note that in such an event no through hole 35d is required.

Alternatively, the surface protection member formation step (step P2a) is carried out by the use of a protection glass plate 35a including a prefabricated conductive layer 40 on one of its surface in the aforementioned step, and the sensor bias lead 16a is connected at the aforementioned position, and a conductive material 42 is injected through the through hole 35d in the mounting step (step P8c). In such an event, preferable examples of the conductive material 42 include a conductive liquid crystal, a conductive resin, and a liquid metal.

Now, characteristics, functions, and advantages of the two-dimensional image detector fabricated by the aforementioned steps will be summarized as follows.

A two-dimensional image detector fabricated in accordance with the present embodiment is characterized in that it includes:

a substrate (glass substrate 2);

an active element array (TFT array 32) disposed on the substrate;

a semiconductor layer, provided on the active element array, for producing electric charges according to incident electromagnetic waves, so that the active element array can read out the produced electric charges; and a protection member (surface protection member 35) provided on the substrate to cover the semiconductor layer (X-ray conductive layer 12).

The arrangement prevents those pollutants produced during the use of the two-dimensional image detector from directly contacting the active element array, the semiconductor layer, etc., effectively preventing quality deterioration of the active element array and the semiconductor layer and offering highly reliable two-dimensional image detectors.

In the arrangement, a portion of the protection member oppositely facing the semiconductor layer is preferably constituted by a solid substrate (protection glass plate 35a).

According to the arrangement, the solid substrate may be composed of, for example, a glass substrate, a resin sheet, or other solid materials containing no solvents and the like that act as pollutants to the semiconductor layer. Therefore, even if the protection member contacts the semiconductor layer, the semiconductor layer is not polluted.

Furthermore, the two-dimensional image detector is preferably such that the protection member is hermetic.

According to the arrangement, the protection member seals out the semiconductor layer from ambient air. Therefore, dew drops and other phenomena can be prevented from developing due to the environment in which the two-dimensional image detector is used, more effectively preventing deterioration in performance of the active element array and the semiconductor layer. Thus, the two-dimensional image detector becomes more reliable.

Furthermore, the two-dimensional image detector may be such that there exists an insulating member filling a gap between the semiconductor layer and the protection member.

According to the arrangement, there exists an insulating member filling a gap between the semiconductor layer and the protection member; therefore, electric discharge does not happen around the semiconductor layer even when a high voltage is applied across the semiconductor layer during the use of the two-dimensional image detector, preventing deterioration in performance of the semiconductor layer due to electric discharge, as well as the aforementioned pollution of the active matrix element and the semiconductor layer. Thus, Thus, the two-dimensional image detector becomes more reliable.

Furthermore, the two-dimensional image detector is preferably such that the insulating member is an insulating gas.

The insulating member, which is a gas, can better fill the gap between the semiconductor layer and the protection member.

Furthermore, the two-dimensional image detector preferably includes:

electrodes (surface electrode layer 16) provided on the semiconductor layer;

a conductive layer 40 provided on a surface of the protection member oppositely facing the electrodes; and a conductive material 42 filling a gap between the electrodes and the conductive layer.

According to the arrangement, the sensor bias lead 16a does not exist in the paths of incoming X-rays, does not cast a shadow in the produced X-ray image, effectively preventing the image quality deterioration.

Especially these advantages are ensured by, as shown in FIG. 13, providing the conductive layer 40 on the protection glass plate (protection member, attached substrate) 35a above, and beyond the borders of, the surface electrode layer 16, and connecting the sensor bias lead 16a to a part of the conductive layer 40 extending beyond the borders of the surface electrode layer 16.

Modification Example

Figure 14:
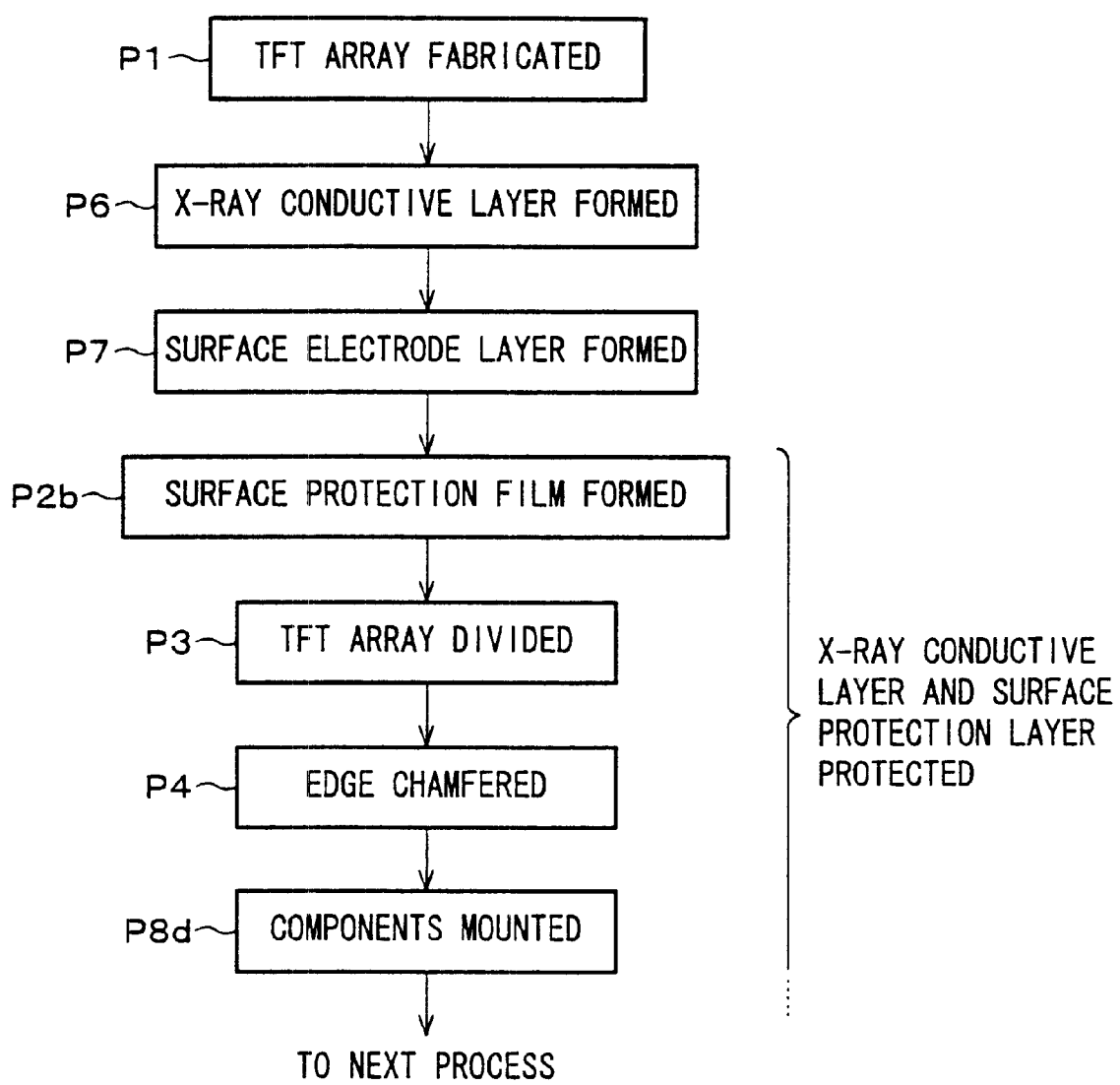
FIG. 14 is a flow chart showing manufacturing steps in sequence, of a two-dimensional image detector, which is a modified example of the second embodiment in accordance with the present invention.
Figure 15:
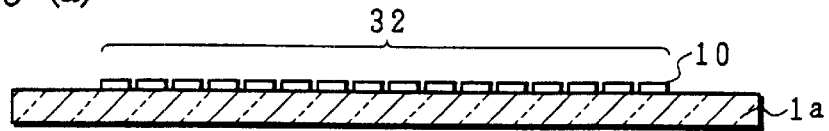
FIG. 15(a) through FIG. 15(g) are cross-sectional views showing the two-dimensional image detector in those steps described in FIG. 14.
Figure 15:
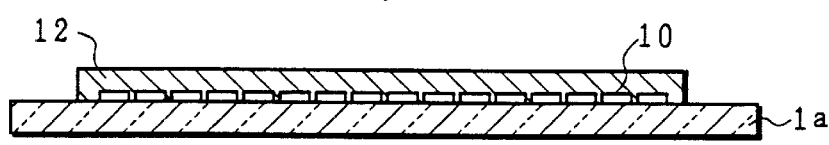
Figure 15:
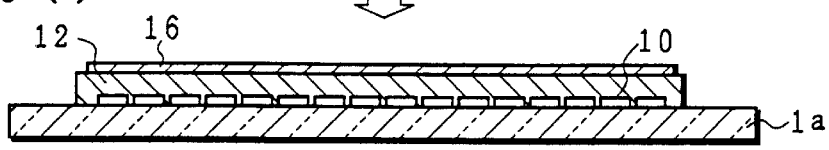
Figure 15:
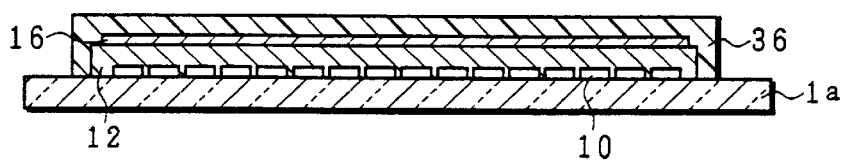
Figure 15:
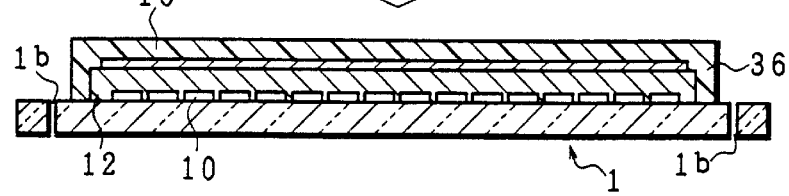
Figure 15:
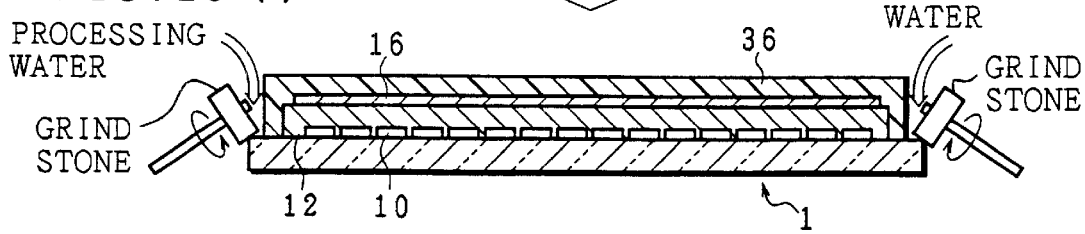
Figure 15:
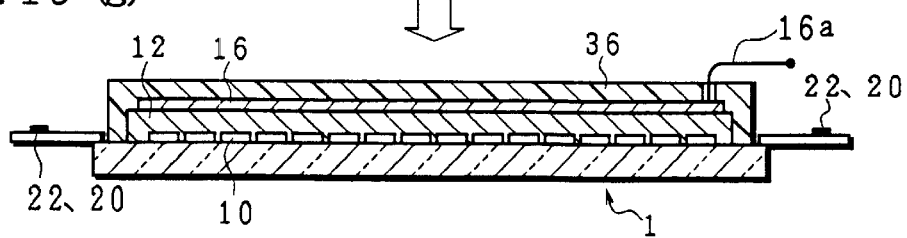

Now, referring to drawings, the following description will discuss a modification example of the present embodiment. FIG. 14 is a flow chart showing manufacturing steps in sequence for a two-dimensional image detector of the present modification example. FIG. 15(a) through FIG. 15(g) are cross-sectional views showing the two-dimensional image detector in those steps described in FIG. 14.

As shown in FIG. 14, in accordance with the present modification example, the manufacturing steps for a two-dimensional image detector include a TFT array fabrication step (step P1), an X-ray conductive layer formation step (step P6), a surface electrode layer formation step (step P7), a surface protection film formation step (step P2b), a TFT array dividing step (step P3), an edge chamfering step (step P4), and a mounting step (step P8d).

FIG. 15(a) through FIG. 15(g) are cross-sectional views showing the two-dimensional image detector in the respective steps. Now, the steps will be discussed in reference to corresponding FIG. 15(a) through FIG. 15(g). Here, for convenience, the steps that are essentially identical to the steps discussed above are indicated by the same reference numerals and description thereof is partly omitted.

In the foregoing discussion, the surface protection member 35 provided included a protection glass plate 35a and a resin sheet. In the present modification example, a surface protection film (protection member) 36 is formed in place of the surface protection member 35, by the use of a resin that can be molded at room temperature.

First, the TFT array fabrication step (step P1), the X-ray conductive layer formation step (step P6), and the surface electrode layer formation step (step P7) are executed in the same manner as in the foregoing.

Next, in the surface protection film formation step (step P2b), a surface protection film 36 is formed in place of the surface protection member 35 (see FIG. 9(d) through FIG. 9(g)).

Here, if the surface protection film 36 needs to be heated during its fabrication, the a-Se film serving as an X-ray conductive layer 12 is likely to crystallize. The crystallization of the a-Se film is prompted at relatively low temperatures of 60° C. to 80° C. (heat resistant temperature). The a-Se film deteriorates in terms of photoelectric conversion characteristics when heated above the heat resistant temperature.

For these reasons, the surface protection film 36 is suitably composed of a material that can be molded below the heat resistant temperature of the X-ray conductive layer 12, for example, a light-curing material or room-temperature curing resin. Specifically, the material for the surface protection film 36 may be selected from a wide range of materials including light-curing acrylic resins, two-part-curing epoxy resins, one-part-curing and two-part-curing silicone resins, two-part-curing polyurethane resins, two-part-curing polyester resins. Alternatively, we can say that light-curing resins and silicon sealants that can cure at room temperature can be used to form the surface protection film 36.

Composed of one of these materials, a resin layer is formed as the surface protection film 36 so as to cover the X-ray conductive layer 12. The surface protection film 36 can be fabricated by printing or spray coating using a mask, so as to cover only the X-ray conductive layer 12 and its immediate vicinity. Here, printing includes screen, letterpress, intaglio, and other conventional printing. With spray coating, vapor resin, which will constitute the surface protection film 36, is sprayed onto a mother glass substrate 1a partly masked where no surface protection film 36 is to be formed.

Alternatively, a flexible sheet composed of an acrylic resin, an epoxy resin, a silicone resin, a urethane resin, or a polyimide resin may be pasted (or transferred) where there exist the X-ray conductive layer 12 or the surface electrode layer 16, using a adhesive agent (or a glue), to form a surface protection film 36. In such a case, since a resin material that is already in a solid state when provided to the mother glass substrate 1a is used as the solid substrate, it becomes possible to use a resin (e.g., polyimide resin) that cures at room temperature as the surface protection film 36.

In other words, adhesive sheet (adhesive tape) composed of a polyimide or similar insulating flexible sheet may be paster where the X-ray conductive layer 12 is provided on the mother glass substrate 1a, so as to form a surface protection film 36. This method is simple and convenient, and can facilitate the fabrication of the surface protection film 36.

As explained in the foregoing, the single surface protection film 36 thus formed on the mother glass substrate 1a so as to cover and contact the X-ray conductive layer 12 can prevent electric discharge and dew drops from occurring or developing in the X-ray conductive layer 12.

Next, following the same procedures as those explained in the foregoing, the TFT array dividing step (step P3) and the edge chamfering step (step P4) are executed in sequence.

These two steps are followed by the mounting step (step P8d). In this step, the driver LSI circuit 22, the amplifier LSI circuit 20, etc. are mounted in the same manner as in the mounting step (step P8c). The sensor bias lead 16a is mounted by providing a hole in a part of the surface protection film 36 to give access to the surface electrode layer 16 and connecting the sensor bias lead 16a to the surface electrode layer 16 through the hole.

In the step above, as in the foregoing, pollutants are prevented from directly contacting the TFT array 32, the X-ray conductive layer 12, etc, which maintains the performance of the TFT array 32 at a satisfactory level and improves the qualities of the X-ray conductive layer 12. As a result, the production yields and reliability of two-dimensional image detectors improve.

The surface protection film 36 may be left unremoved after the completion of the two-dimensional image detector, giving substantially perpetual protection to the area where the X-ray conductive layer 12 is formed. The surface protection film 36 thus can maintain a state in which electric discharge or dew drops are unlikely to occur in the X-ray conductive layer 12. This further improves the reliability and insusceptibility of the two-dimensional image detector to environmental conditions.

Figure 16:
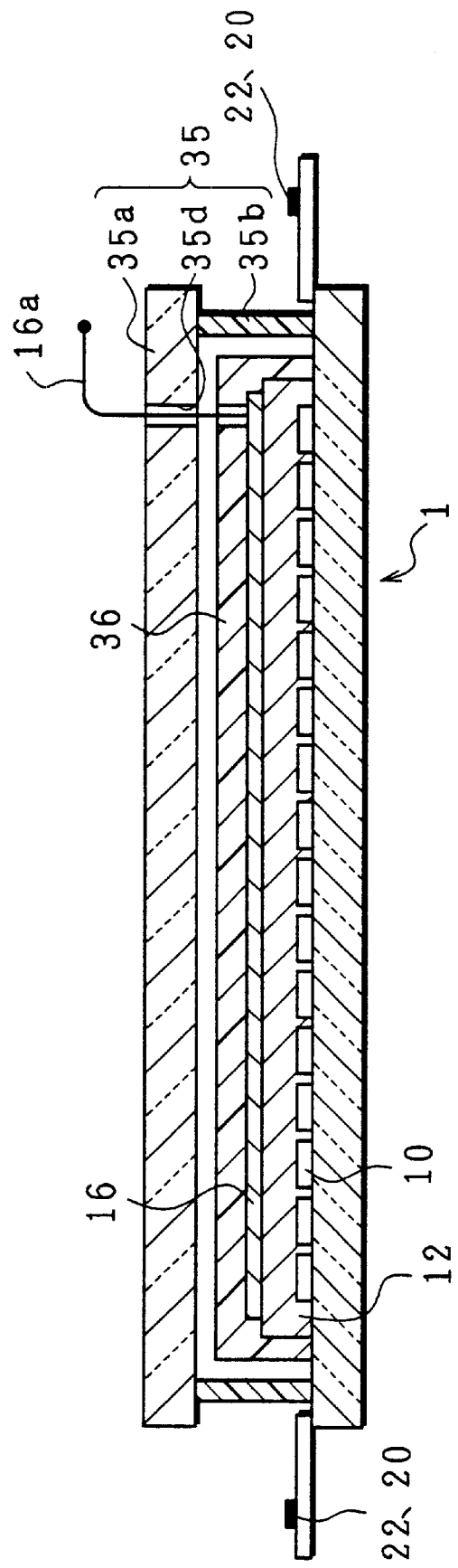
FIG. 16 is a cross-sectional view schematically showing a structure of a two-dimensional image detector such that there is further provided a surface protection member so as to cover a surface protection film shown in FIG. 15(g).
Figure 17:
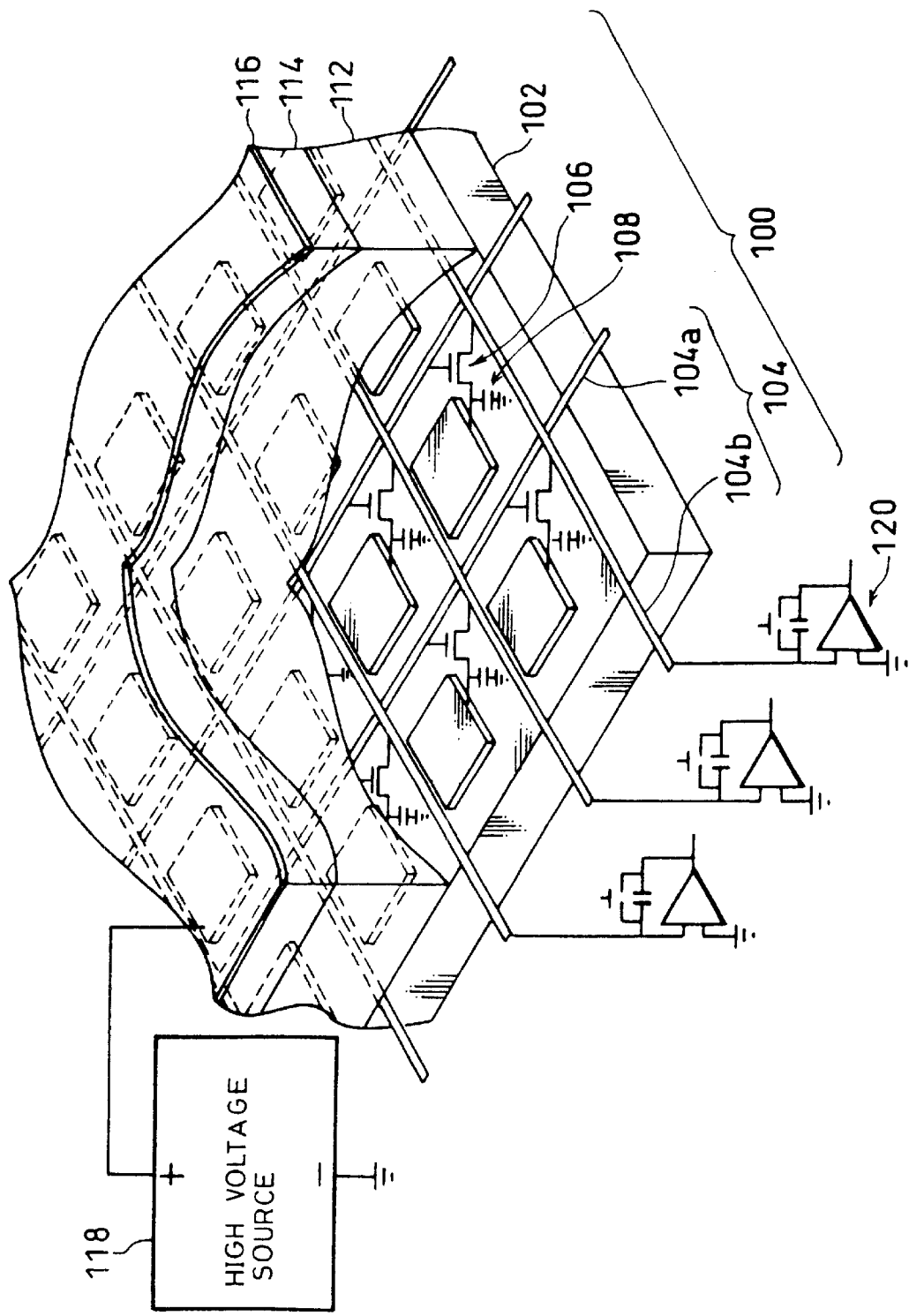
FIG. 17 is a perspective view schematically showing a structure of a conventional two-dimensional image detector.

After completely forming the surface protection film 36 in the present modification example, as shown in FIG. 16, a surface protection member 35 may be further provided as in FIG. 9(d). The provision enhances the protection of the X-ray conductive layer 12.

Now, characteristics, functions, and advantages of the two-dimensional image detector fabricated by the aforementioned steps will be summarized as follows.

A two-dimensional image detector fabricated in accordance with the present embodiment is characterized in that it includes:

a substrate (glass substrate 2);

an active element array (TFT array 32) disposed on the substrate;

a semiconductor layer, provided on the active element array, for producing electric charges according to incident electromagnetic waves, so that the active element array can read out the produced electric charges; and a protection member (surface protection film 36) provided on the substrate to cover the semiconductor layer (X-ray conductive layer 12), wherein
the protection member is preferably made of a material that can be fabricated below a heat resistant temperature of the semiconductor layer.

If the semiconductor layer is made of an a-Se film for example, the crystallization of the semiconductor layer is prompted at relatively low temperatures of 60° C. to 80° C. (heat resistant temperature). Such a semiconductor layer deteriorates in terms of photoelectric conversion characteristics when heated above the heat resistant temperature. According to the arrangement, the protection member is composed of a material (for example, silicone resin) that can be fabricated below the heat resistant temperature of the semiconductor layer; therefore, the deterioration of the characteristics of the semiconductor layer is avoidable.

Furthermore, the two-dimensional image detector is preferably such that the protection member includes:

a surface protection film 36 composed of a resin;

a solid substrate (protection glass plate 35a) covering the surface protection film 36; and a connecting member (sealant 35b) for securing the solid substrate to the substrate (the structure is shown in FIG. 16).

According to the arrangement, the semiconductor layer is given double protection. This provides better protection to the semiconductor layer.

In the present invention, the surface protection member 35 and the surface protection film 36 are employed for the purpose of achieving both the object in the manufacturing process of the two-dimensional image detector and the object after the completion of the two-dimensional image detector. By contrast, if only the latter object needs to be achieved, the two-dimensional image detector may be manufactured by other methods than those discussed in the foregoing. If a two-dimensional image detector is manufactured by other methods than the present invention, however, with the same structure upon completion as the present invention, it will have the same advantages as the two-dimensional image detector in accordance with the present invention.

As detailed so far, a manufacturing method for a two-dimensional image detector in accordance with the present invention is a manufacturing method for a two-dimensional image detector including:

a semiconductor layer for producing electric charges according to incident electromagnetic waves; and a substrate having an active element array for reading out the electric charges produced by the semiconductor layer, the manufacturing method preferably including the steps of:

(1) forming the active element array on the substrate;
(2) forming a protection member on the substrate so as to cover an area in which the active element array is formed;

(3) dividing into smaller pieces the substrate on which the protection member is already formed;

(4) removing the protection member from the divided pieces; and (5) forming the semiconductor layer on the active element array where the protection member is removed.

A manufacturing method for a two-dimensional image detector in accordance with the present invention incorporates all the features of the foregoing manufacturing method for a two-dimensional image detector, and preferably further includes the step of mounting a circuit component on the substrate, the circuit component being connected to the active element array, after the division of the substrate and before the removal of the protection member.

According to the method, an active element array is formed on a substrate, and then a protection member is formed on the active element array. Subsequently, the substrate is divided. Further, with the protection member still remaining in place, a circuit component for connecting to the active element array is mounted on the substrate. After removing the protection member, a semiconductor layer is formed on a surface of the active element array which was protected by the protection member.

When circuit components are mounted on the substrate, gases and dust may be produced in some cases that pollute the active element array and the semiconductor layer. The pollutants, if having contacted the active element array and the semiconductor layer, would invite deterioration of performance by the active element array and the semiconductor layer.

However, in the foregoing method, the active element array is protected by the protection member during the mounting of the circuit components, as well as during the division of the substrate. Further, the semiconductor layer is formed after the mounting of circuit components. Therefore, the active element array and the semiconductor layer are prevented from contacting pollutants produced in mounting. Thus, the performance of the active element array and the semiconductor layer is better, protected from deterioration, and the reliability thereof improves.

As a result, the performance of the active element array and the semiconductor layer can be better maintained at a satisfactory level, and two-dimensional image detector can be manufactured with higher reliability.

A manufacturing method for a two-dimensional image detector in accordance with the present invention incorporates all the features of the foregoing manufacturing method for a two-dimensional image detector, and is preferably such that the protection member is made of a photosensitive resin.

Scribe technologies are a preferred method of dividing the substrate, because it involves a simple device and exhibits excellent operational performance. If there is a protection member or the like covering parts of the substrate where the substrate is divided, it obstructs the formation of scribe lines. Accordingly, to use a scribe technology, the substrate needs to be exposed where it is divided.

In the foregoing method, the protection member is composed of a photosensitive resin, and therefore can be readily patterned by means of coating, exposure, development, as in, for example, photolithography. Thus, the protection member can be patterned so as to cover where the active element array is formed on the substrate and removed from parts of the substrate where it will be later divided. Scribe technologies are thus available.

As a result, it becomes possible to manufacture two-dimensional image detectors by a relatively simple steps with higher reliability.

Alternatively, a manufacturing method for a two-dimensional image detector in accordance win the present invention incorporates all the features of the foregoing manufacturing method for a two-dimensional image detector, and is preferably such that the protection member is made of an aqueous resin.

In the foregoing method, the projection member is composed of an aqueous resin, and therefore can be removed by the use of water or warm water in a later step of removing the protection member. The steps of removing the protection member therefore does not need a special device, allowing for a relatively simple configuration of the production line. Further, since no special solvent is not needed to remove the protection member, it becomes possible to reduce negative effects of the use of solvents on the active element array and the components disposed on the substrate, as well as negative effects of the manufacture of two-dimensional image detectors on the environment.

As a result, it becomes possible to manufacture two-dimensional image detectors by simple, environment-friendly steps with higher reliability.

A manufacturing method for a two-dimensional image detector in accordance with the present invention is a manufacturing method for a two-dimensional image detector including:

a semiconductor layer for producing electric charges according to incident electromagnetic waves; and a substrate having an active element array for reading out the electric charges produced by the semiconductor layer, the manufacturing method preferably including the steps of:

(1) forming the active element array on the substrate;

(2) forming the semiconductor layer on the active element array;

(3) forming a protection member on the substrate so as to cover an area in which the semiconductor layer is formed; and (4) dividing the substrate on which the protection member is already formed.

A two-dimensional image detector in accordance with the present invention preferably includes:

a substrate;

an active element array provided on the substrate;

a semiconductor layer, provided on the active element array, for producing electric charges according to incident electromagnetic waves so that the electric charges are read out by the active element array; and a protection member, provided on the substrate, for covering the semiconductor layer.

A two-dimensional image detector in accordance with the present invention incorporates all the features of the foregoing two-dimensional image detector, and is preferably such that the protection member is hermetic.

According to the arrangement, the protection member is capable of maintaining the hermetical sealing of the semiconductor layer from ambient air. Therefore, dew drops and other phenomena can be prevented from developing due to the environment in which the two-dimensional image detector is used, more effectively preventing deterioration in performance of the active element array and the semiconductor layer. Thus, the two-dimensional image detector becomes more reliable.

Alternatively, a two-dimensional image detector in accordance with the present invention incorporates all the features of the foregoing two-dimensional image detector, and preferably such that a gap between the semiconductor layer and the protection member is filled with an electrically insulating substance.

According to the arrangement, by filling up the gap between the semiconductor layer and the protection member with an electrically insulating substance, electric discharge is prevented from happening around the semiconductor layer even when a high voltage is applied to the semiconductor layer during the use of the two-dimensional image detector. This prevents the deterioration in performance of the semiconductor layer due to electric discharge, in addition to the aforementioned pollution of the active matrix element and the semiconductor layer. Thus, it becomes possible to offer two-dimensional image detectors with even higher reliability.

Alternatively, a two-dimensional image detector in accordance with the present invention incorporates all the features of the foregoing two-dimensional image detector, and preferably such that a gap between the semiconductor layer and the protection member is filled with a conductive member.

According to the arrangement, by filling up the gap between the semiconductor layer and the protection member with a conductive member, the area can be maintained equal in terms of electric potential. This also prevents electric discharge from happening around the semiconductor layer.

Furthermore, according to the arrangement, electricity needs to be supplied to the conductive member to apply an electric field to the semiconductor layer, which offers a wider ranges of choices on where electricity is to be applied. It thus becomes possible to prevent leads from overlapping an area at which the image is read and casting a shadow in the produced image causing deterioration in image quality.

As a result, two-dimensional image detectors can be manufactured with high reliability and satisfactory image quality.

A two-dimensional image detector in accordance with the present invention incorporates all the features of the foregoing two-dimensional image detector, and preferably such that a portion of the protection member oppositely facing the semiconductor layer is constituted by a solid substrate.

According to the arrangement, the solid substrate may be composed of, for example, a glass substrate, a resin sheet, or other solid materials containing no solvents and the like that act as pollutants to the semiconductor layer. Therefore, even if the protection member contacts the semiconductor layer, the semiconductor layer can be prevented from becoming polluted.

A two-dimensional image detector in accordance with the present invention incorporates all the features of the foregoing two-dimensional image detector, and preferably such that the protection member includes:

a surface protection film composed of a resin;

a solid substrate covering the surface protection film; and a connecting member for securing the solid substrate to the substrate.

According to the arrangement, the semiconductor layer is given double protection. This provides better protection to the semiconductor layer.

A two-dimensional image detector in accordance with the present invention preferably includes:

a substrate;

an active element array provided on the substrate;

a semiconductor layer, provided on the active element array, for producing electric charges according to incident electromagnetic waves so that the electric charges are read out by the active element array;

a surface electrode layer, provided on the semiconductor layer, for allowing a bias voltage to be applied to the semiconductor layer; and a protection member, provided on the substrate, for covering the semiconductor layer and the surface electrode layer.

A two-dimensional image detector in accordance with the present invention incorporates all the features of the foregoing two-dimensional image detector, and is preferably such that the protection member is composed of a resin material formed by coating or transfer.

According to the arrangement, the protection member is formed of a coating-type resin material that can be readily fabricated by coating by the use of a spray or print technology or transfer by the use of an adhesive agent; therefore, the protection member can be readily fabricated.

Further, if the resin material can be deposited at relatively low temperatures, even when a-Se with a low heat resistant temperature is used for the semiconductor layer in the two-dimensional image detector, the protection member can be formed without degrading photoelectric conversion characteristics of the a-Se.

A two-dimensional image detector in accordance with the present invention incorporates all the features of the foregoing two-dimensional image detector, and is preferably such that the protection member is constituted by a solid substrate that is already in a solid state when attached to the substrate.

According to the arrangement, the solid substrate, which is already in a solid state when attached to the substrate, does not contain solvents, ions, or other pollutants that pollute the semiconductor layer. Therefore, even if the protection member contacts the semiconductor layer or the surface electrode layer when attached to the substrate, the semiconductor layer and the surface electrode layer are prevented from becoming polluted.

A two-dimensional image detector in accordance with the present invention incorporates all the features of the foregoing two-dimensional image detector, and is preferably such that the protection member includes:

a solid substrate that is already in a solid state when attached to the substrate; and a connecting member for securing the solid substrate to the substrate.

According to the arrangement, the protection member includes: a solid substrate that is already in a solid state when attached to the substrate; and a connecting member for securing the solid substrate to the substrate. Under these conditions, by disposing the connecting member along the periphery of the solid substrate so as to frame the solid substrate for example, the connecting member and the solid substrate can keep the semiconductor layer and the surface electrode layer hermetically sealed from ambient air. Therefore, pollutants and dew drops are prevented from being produced during the use of the two-dimensional image detector. This effectively prevents the deterioration in the performance of the active element array, the semiconductor layer, and the surface electrode layer, and enables two-dimensional image detectors to be manufactured with even higher reliability.

A two-dimensional image detector in accordance with the present invention incorporates all the features of the foregoing two-dimensional image detector, and is preferably such that the solid substrate is a ceramic substrate.

According to the arrangement, the solid substrate constituted by a ceramic substrate, if disposed to the substrate on which the active element array is formed, can impart an extra strength to the substrate.

A two-dimensional image detector in accordance with the present invention incorporates all the features of the foregoing two-dimensional image detector, and is preferably such that the ceramic substrate is a glass substrate.

Since the ceramic substrate (solid substrate) is made of glass, if the substrate on which the active element array is formed is constituted by a glass substrate, the two substrates have identical coefficients of thermal expansion. This arrangement prevents the substrates from warping due to a difference in their coefficients of thermal expansion, even if the substrate on which the active element array is formed and the solid substrate (protection member) are both secured.

A two-dimensional image detector in accordance with the present invention incorporates all the features of the foregoing two-dimensional image detector, and is preferably such that the ceramic substrate is composed of one of the materials consisting of aluminum oxide, aluminum nitride, boron nitride, silicon oxide, and silicon carbide.

The ceramic substrate (solid substrate), when composed of one of the materials consisting of aluminum oxide, aluminum nitride, boron nitride, silicon oxide, and silicon carbide, absorbs a reduced amount of X-rays in comparison to the ceramic substrate composed of glass; therefore the use of the ceramic substrate can prevent a significant drop in the sensitivity of the two-dimensional image detector.

A two-dimensional image detector in accordance with the present invention incorporates all the features of the foregoing two-dimensional image detector, and is preferably such that the ceramic substrate is composed of a mixture of two or more of the materials constituting of aluminum oxide, aluminum nitride, boron nitride, silicon oxide, and silicon carbide at an arbitrary ratio.

If tow or more of the ceramic materials are mixed at an arbitrary ratio to obtain the solid substrate, the coefficient of thermal expansion can be arbitrarily specified by changing the mixture ratio. This enables the ceramic substrate formed to have substantially the same coefficient of thermal expansion as the substrate on which the active element array is formed, and thus ensures the prevention of the substrates from warping due to a difference in the coefficients of thermal expansion.

A two-dimensional image detector in accordance with the present invention incorporates all the features of the foregoing two-dimensional image detector, and is preferably such that the solid substrate is a resin substrate.

According to the arrangement, the solid substrate constituted by a resin substrate, if disposed to the substrate on which the active element array is formed, can impart an extra strength to the substrate. Further, a resin substrate can be readily fabricated, allowing for easy formation of, for example, a through hole and notch therein. This ensures the application of a bias voltage to the surface electrode layer through the through hole or notch. Besides, the resin substrate is relative light in weight in comparison to glass and other ceramic substrates, which contributes to a reduction in the weight of the two-dimensional image detector.

A two-dimensional image detector in accordance with the present invention incorporates all the features of the foregoing two-dimensional image detector, and is preferably such that the resin substrate is composed of a resin containing no Si element.

According to the arrangement, the use of a resin substrate with no Si element reduces the absorption of X-rays by the solid substrate in comparison to Si-containing glass or ceramic substrates. This ensures the prevention of a drop in the sensitivity of the two-dimensional image detector caused by the provision of the solid substrate.

A two-dimensional image detector in accordance with the present invention incorporates all the features of the foregoing two-dimensional image detector, and is preferably such that a gap between the semiconductor layer and the protection member is filled with an electrically insulating substance.

According to the arrangement, by filling up the gap between the semiconductor layer and the protection member with an electrically insulating substance, electric discharge is prevented from happening around the semiconductor layer and the surface electrode layer even when a high voltage is applied to the semiconductor layer via the surface electrode layer during the use of the two-dimensional image detector. This ensures the protection of components from destruction due to electric discharge and the prevention of the deterioration in performance of the semiconductor layer and the surface electrode layer due to electric discharge, in addition to the prevention of the aforementioned pollution and formation of dew drops in the active matrix element, the semiconductor layer, and the surface electrode layer.

A two-dimensional image detector in accordance wist the present invention incorporates all the features of the foregoing two-dimensional image detector, and is preferably such that a gap between the semiconductor layer and the protection member is filled with a conductive member.

According to the arrangement, by filling up the gap between the semiconductor layer and the protection member with a conductive member, the area can be maintained equal in terms of electric potential. Therefore, electric discharge is prevented from happening around the semiconductor layer and the surface electrode layer even when a high voltage is applied to the semiconductor layer via the surface electrode layer. This ensures the protection of components from destruction due to electric discharge and the prevention of the deterioration in performance of the semiconductor layer and the surface electrode layer due to electric discharge, in addition to the prevention of the aforementioned pollution and formation of dew dross in the active matrix element, the semiconductor layer, and the surface electrode layer.

Furthermore, according to the arrangement, electricity needs to be supplied to the conductive member to apply an electric field to the semiconductor layer, which offers a wider ranges of choices on where electricity is to be applied. It thus becomes possible to prevent leads from overlapping an area at which the image is read and casting a shadow in the produced image causing deterioration in image quality.

A two-dimensional image detector in accordance with the present invention incorporates all the features of the foregoing two-dimensional image detector, and is preferably such that a metal film is formed on a surface of the protection member opposite to a surface thereof facing the semiconductor layer.

According to the arrangement, by forcing a metal film on a surface of the protection member opposite to a surface thereof facing the semiconductor layer, enhanced electrical shield and light obstruction is imparted to the two-dimensional image detector. The buildup of static electricity is also preventable.

A two-dimensional image detector in accordance with the present invention incorporates all the features of the foregoing two-dimensional image detector, and is preferably such that the protection member is provided with a through hole or a notch through which a bias voltage is applied to the surface electrode layer.

According to the arrangement, the protection member is provided with a through hole or a notch; therefore, a bias voltage can be readily applied to the surface electrode layer through the through hole or the notch with the protection member being already provided on the substrate. The through hole and the notch may be disposed along the periphery of the protection member, for example.

A two-dimensional image detector in accordance with the present invention incorporates all the features of the foregoing two-dimensional image detector, and is preferably such that the surface electrode layer is provided with a surface electrode pull-out holder through which a bias voltage is applied to the surface electrode layer so that it partially extends external to the protection member.

According to the arrangement, the surface electrode layer is provided with a surface electrode pull-out holder partially extending external to the protection member; therefore, a bias voltage can be readily applied to the surface electrode layer through the surface electrode pull-out holder with the protection member being already provided on the substrate.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method of manufacturing a two-dimensional image detector including:
   a semiconductor layer for producing electric charges according to incident electromagnetic waves; and
   a substrate having an active element array for reading out the electric charges produced by the semiconductor layer,
   the manufacturing method comprising the steps of:
   (1) forming the active element array on the substrate;
   (2) forming the semiconductor layer on the active element array;
   (3) forming a protection member on the substrate so as to cover an area in which the semiconductor layer is formed, without covering areas near predetermined dividing lines of the substrate; and
   (4) dividing the substrate, along the predetermined dividing lines, on which the protection member is already formed.

2. The method of manufacturing a two-dimensional image detector as defined in claim 1, wherein in the step (3),
   the protection member is constituted by a solid substrate and a connecting member, and the solid substrate is secured to the substrate using the connecting member after forming the connecting member at a circumference of the semiconductor layer in the substrate.

3. The method of manufacturing a two-dimensional image detector as defined in claim 2, further comprising the step of
   filling up a space surrounded by the solid substrate and the substrate with an electrically insulating substance.

4. The method of manufacturing a two-dimensional image detector as defined in claim 2, further comprising the step of
   forming a metal film on a surface of the solid substrate opposite to a surface thereof facing the semiconductor layer.

5. A method of manufacturing a two-dimensional image detector including:
   a semiconductor layer for producing electric charges according to incident electromagnetic waves; and
   a substrate having an active element array for reading out the electric charges produced by the semiconductor layer,
   the manufacturing method comprising the steps of:
   (1) forming the active element array on the substrate;
   (2) forming the semiconductor layer so as to cover the active element array;
   (3) forming on the semiconductor layer a surface electrode layer through which a bias voltage is applied to the semiconductor layer;
   (4) forming a protection member on the substrate so as to cover the semiconductor layer and the surface electrode layer, without covering areas near predetermined dividing lines of the substrate; and
   (5) dividing into smaller pieces the substrate, along the predetermined dividing lines, on which the protection member is already formed.

6. The method of manufacturing a two-dimensional image detector as defined in claim 5, wherein in the step (4),
   the protection member is constituted by a solid substrate and a connecting member, and the solid substrate is secured to the substrate using the connecting member after forming the connecting member at a circumference of the semiconductor layer in the substrate.

7. The method of manufacturing a two-dimensional image detector as defined in claim 6, further comprising the step of
   filling up a space surrounded by the solid substrate and the substrate with an electrically insulating substance.

8. The method of manufacturing a two-dimensional image detector as defined in claim 6,
   wherein
   a conductive layer is formed on one of two surfaces of the secured substrate, and the secured substrate is secured to the substrate using the connecting member so as to sandwich a conductive material between the conductive layer and the surface electrode layer.

9. The method of manufacture a two-dimensional image detector as defined in claim 8, wherein
   the conductive layer is formed on the secured substrate so as to oppositely face, and extend beyond, the surface electrode layer.

10. The method of manufacturing a two-dimensional image detector as defined in claim 6, further comprising the step of
    forming a metal film on a surface of the solid substrate opposite to a surface thereof facing the semiconductor layer.

11. A method of manufacturing a two-dimensional image detector as recited in claim 1 wherein all of the predetermined dividing lines are provided so as to be exposed.

12. A method of manufacturing a two-dimensional image detector as recited in claim 5 wherein all of the predetermined dividing lines are provided so as to be exposed.

* * * * *

UNITED STATES PATENT AND TRADEMARK OFFICE
CERTIFICATE OF CORRECTION

| | |
|---|---|
| PATENT NO. | : 6,649,438 B2 |
| APPLICATION NO. | : 10/329491 |
| DATED | : November 18, 2003 |
| INVENTOR(S) | : Izumi et al. |

It is certified that error appears in the above-identified patent and that said Letters Patent is hereby corrected as shown below:

On the Title page, please correct the Assignee (73) to read as follows:

(73) Assignee: Sharp Kabushiki Kaisha, Osaka (JP)
Shimadzu Corporation, Kyoto (JP)

Signed and Sealed this
Fourteenth Day of June, 2011

David J. Kappos
*Director of the United States Patent and Trademark Office*